(12) United States Patent
Leem et al.

(10) Patent No.: US 11,495,640 B2
(45) Date of Patent: Nov. 8, 2022

(54) ORGANIC PHOTOELECTRONIC DEVICE AND IMAGE SENSOR

(71) Applicant: Samsung Electronics Co., Ltd., Suwon-si (KR)

(72) Inventors: Dong-Seok Leem, Hwaseong-si (KR); Kwang Hee Lee, Yongin-si (KR); Tadao Yagi, Hwaseong-si (KR); Sung Young Yun, Suwon-si (KR); Gae Hwang Lee, Seongnam-si (KR); Seon-Jeong Lim, Yongin-si (KR); Yong Wan Jin, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 806 days.

(21) Appl. No.: 15/471,289

(22) Filed: Mar. 28, 2017

(65) Prior Publication Data
US 2018/0006090 A1    Jan. 4, 2018

(30) Foreign Application Priority Data

Jun. 29, 2016   (KR) .......................... 10-2016-0081554

(51) Int. Cl.
*H01L 47/00*   (2006.01)
*H01L 27/30*   (2006.01)
(Continued)

(52) U.S. Cl.
CPC .......... *H01L 27/307* (2013.01); *H01L 51/002* (2013.01); *H01L 51/0064* (2013.01);
(Continued)

(58) Field of Classification Search
CPC ..... C08G 61/123; H01L 27/307; H01L 51/44; H01L 2251/303; H01L 51/0046;
(Continued)

(56) References Cited

U.S. PATENT DOCUMENTS

| | | | |
|---|---|---|---|
| 907,088 | A | 12/1908 | Noisom et al. |
| 6,078,258 | A | 6/2000 | Auerbach et al. |

(Continued)

FOREIGN PATENT DOCUMENTS

| | | |
|---|---|---|
| CN | 104230953 A | 12/2014 |
| DE | 87576 A | 2/1972 |

(Continued)

OTHER PUBLICATIONS

Yuan et al., "Intermediate Layers in Tandem Organic Solar Cells," Green 1 (2011), pp. 65-80.*
(Continued)

*Primary Examiner* — Jay C Kim
(74) *Attorney, Agent, or Firm* — Harness, Dickey & Pierce, P.L.C.

(57) ABSTRACT

An organic photoelectronic device includes a first electrode and a second electrode facing each other and a light-absorption layer between the first electrode and the second electrode and including a photoelectric conversion region including a p-type light-absorbing material and an n-type light-absorbing material and a doped region including an exciton quencher and at least one of the p-type light-absorbing material and the n-type light-absorbing material, wherein at least one of the p-type light-absorbing material and the n-type light-absorbing material selectively absorbs a part of visible light, and an image sensor includes the same.

20 Claims, 14 Drawing Sheets

(51) Int. Cl.
  *H01L 51/42* (2006.01)
  *H01L 51/00* (2006.01)
  *H01L 51/44* (2006.01)

(52) U.S. Cl.
  CPC ...... *H01L 51/4253* (2013.01); *H01L 51/4293* (2013.01); *H01L 51/44* (2013.01); *H01L 51/006* (2013.01); *H01L 51/0046* (2013.01); *H01L 51/0047* (2013.01); *H01L 51/0053* (2013.01); *H01L 51/0058* (2013.01); *H01L 51/0061* (2013.01); *H01L 51/0062* (2013.01); *H01L 51/0067* (2013.01); *H01L 51/0071* (2013.01); *H01L 51/0072* (2013.01); *H01L 2251/303* (2013.01)

(58) Field of Classification Search
  CPC ............. H01L 51/0047; H01L 51/0053; H01L 51/0058; H01L 51/006; H01L 51/0061; H01L 51/0062; H01L 51/0067; H01L 51/0071; H01L 51/0072
  See application file for complete search history.

(56) References Cited

U.S. PATENT DOCUMENTS

| | | | |
|---|---|---|---|
| 6,087,258 A | 7/2000 | Simpson et al. | |
| 6,239,355 B1* | 5/2001 | Salafsky | H01L 31/0384 136/250 |
| 6,300,612 B1 | 10/2001 | Yu | |
| 6,657,378 B2* | 12/2003 | Forrest | H01L 27/302 250/208.1 |
| 6,670,213 B2* | 12/2003 | Halls | H01L 51/0026 438/52 |
| 6,824,952 B1 | 11/2004 | Minsek et al. | |
| 6,972,431 B2* | 12/2005 | Forrest | H01L 51/4246 438/82 |
| 7,129,466 B2 | 10/2006 | Iwasaki | |
| 7,141,863 B1 | 11/2006 | Compaan et al. | |
| 7,196,366 B2* | 3/2007 | Forrest | B82Y 10/00 257/292 |
| 7,326,955 B2* | 2/2008 | Forrest | B82Y 10/00 257/40 |
| 7,375,370 B2* | 5/2008 | Forrest | B82Y 10/00 136/243 |
| 7,675,057 B2* | 3/2010 | Drechsel | H01L 51/424 257/40 |
| 7,768,194 B2* | 8/2010 | Forrest | H01L 51/0072 313/506 |
| 7,893,352 B2* | 2/2011 | Thompson | H01L 51/424 136/263 |
| 7,915,701 B2* | 3/2011 | Forrest | H01L 51/4246 257/440 |
| 7,947,897 B2* | 5/2011 | Rand | B82Y 10/00 136/263 |
| 7,973,307 B2 | 7/2011 | Rand et al. | |
| 7,982,130 B2* | 7/2011 | Forrest | B82Y 10/00 136/263 |
| 8,017,863 B2* | 9/2011 | Forrest | H01L 51/4246 136/263 |
| 8,035,708 B2 | 10/2011 | Takizawa et al. | |
| 8,378,339 B2 | 2/2013 | Nomura et al. | |
| 8,426,727 B2 | 4/2013 | Pfeiffer et al. | |
| 8,466,452 B2* | 6/2013 | Kim | B82Y 10/00 257/40 |
| 8,471,246 B2 | 6/2013 | Suzuki et al. | |
| 8,525,577 B2 | 9/2013 | Yofu et al. | |
| 8,592,680 B2* | 11/2013 | Rand | H01L 51/424 136/263 |
| 8,633,475 B2* | 1/2014 | Endo | H01L 51/5278 438/46 |
| 8,637,860 B2 | 1/2014 | Nomura et al. | |
| 8,704,213 B2 | 4/2014 | Suzuki | |
| 8,704,281 B2 | 4/2014 | Maehara et al. | |
| 8,766,291 B2* | 7/2014 | Forrest | H01L 51/5004 257/89 |
| 8,847,066 B2* | 9/2014 | Holmes | H01L 51/4253 136/255 |
| 8,847,141 B2 | 9/2014 | Fukuzaki et al. | |
| 8,847,208 B2 | 9/2014 | Mitsui et al. | |
| 8,860,016 B2 | 10/2014 | Suzuki | |
| 8,933,438 B2 | 1/2015 | Leem et al. | |
| 8,987,589 B2* | 3/2015 | Rand | H01L 51/4246 136/263 |
| 8,994,132 B2 | 3/2015 | Mitsui et al. | |
| 9,024,181 B2* | 5/2015 | Pfeiffer | H01L 51/4293 136/263 |
| 9,029,837 B2* | 5/2015 | Forrest | H01L 51/5012 257/40 |
| 9,054,329 B2* | 6/2015 | Coe-Sullivan | H01L 33/28 |
| 9,070,887 B2 | 6/2015 | Yofu et al. | |
| 9,070,888 B2 | 6/2015 | Leem | |
| 9,505,770 B2* | 11/2016 | McGrath | C07D 487/22 |
| 9,508,945 B2* | 11/2016 | Holmes | H01L 51/4246 |
| 9,543,361 B2 | 1/2017 | Leem et al. | |
| 9,548,463 B2 | 1/2017 | Yagi et al. | |
| 9,577,221 B2* | 2/2017 | Weaver | H01L 51/5072 |
| 9,608,212 B2* | 3/2017 | Ishibe | H01L 51/008 |
| 9,680,103 B2* | 6/2017 | Sugiura | C08G 61/12 |
| 9,941,477 B2 | 4/2018 | Choi et al. | |
| 9,960,362 B2 | 5/2018 | Bulliard et al. | |
| 10,069,095 B2* | 9/2018 | Forrest | B82Y 10/00 |
| 10,074,810 B2* | 9/2018 | Lui | H01L 51/0059 |
| 10,326,083 B2 | 6/2019 | Yagi et al. | |
| 10,461,256 B2 | 10/2019 | Choi et al. | |
| 10,505,146 B2 | 12/2019 | Heo et al. | |
| 10,978,654 B2* | 4/2021 | Forrest | H01L 51/5004 |
| 11,094,902 B2* | 8/2021 | Forrest | H01L 51/4253 |
| 2004/0192942 A1 | 9/2004 | Huang | |
| 2005/0217722 A1 | 10/2005 | Komatsu et al. | |
| 2006/0076050 A1 | 4/2006 | Williams et al. | |
| 2007/0012955 A1 | 1/2007 | Ihama | |
| 2007/0063156 A1 | 3/2007 | Hayashi | |
| 2007/0090371 A1 | 4/2007 | Drechsel et al. | |
| 2010/0084011 A1* | 4/2010 | Forrest | B82Y 10/00 136/255 |
| 2010/0207112 A1 | 8/2010 | Furst et al. | |
| 2011/0012091 A1 | 1/2011 | Forrest et al. | |
| 2011/0074491 A1* | 3/2011 | Yofu | B82Y 10/00 327/514 |
| 2012/0126204 A1 | 5/2012 | So et al. | |
| 2012/0217448 A1* | 8/2012 | Yoshimura | C08G 61/122 252/500 |
| 2012/0266958 A1 | 10/2012 | Aksu et al. | |
| 2012/0313088 A1 | 12/2012 | Yofu et al. | |
| 2013/0062595 A1* | 3/2013 | Park | H01L 51/4253 257/40 |
| 2013/0087682 A1 | 4/2013 | Nomura | |
| 2013/0181202 A1 | 7/2013 | Yofu et al. | |
| 2013/0206218 A1* | 8/2013 | Holmes | H01L 51/4273 136/255 |
| 2013/0299799 A1 | 11/2013 | Yofu et al. | |
| 2014/0008619 A1 | 1/2014 | Lee et al. | |
| 2014/0054442 A1 | 2/2014 | Huang et al. | |
| 2014/0083496 A1 | 3/2014 | Shibasaki et al. | |
| 2014/0159752 A1 | 6/2014 | Tsai et al. | |
| 2014/0209173 A1 | 7/2014 | Momose | |
| 2014/0319509 A1 | 10/2014 | Hattori et al. | |
| 2015/0053942 A1 | 2/2015 | Kho et al. | |
| 2015/0060775 A1 | 3/2015 | Liang et al. | |
| 2015/0162548 A1 | 6/2015 | Lim et al. | |
| 2015/0200226 A1* | 7/2015 | Jin | H01L 27/14645 257/432 |
| 2015/0228811 A1 | 8/2015 | Hiroi et al. | |
| 2015/0287946 A1* | 10/2015 | Leem | C07F 5/02 257/40 |
| 2015/0349073 A1 | 12/2015 | Kang | |
| 2015/0349283 A1* | 12/2015 | Forrest | H01L 51/0056 257/40 |
| 2016/0013248 A1 | 1/2016 | Sawaki | |
| 2016/0013424 A1 | 1/2016 | Yamamoto et al. | |
| 2016/0020258 A1 | 1/2016 | Park et al. | |

(56) References Cited

U.S. PATENT DOCUMENTS

| | | | |
|---|---|---|---|
| 2016/0064672 A1 | 3/2016 | Lee et al. | |
| 2016/0099417 A1 | 4/2016 | Sato et al. | |
| 2016/0100153 A1 | 4/2016 | Jeon et al. | |
| 2016/0111561 A1 | 4/2016 | Hsu et al. | |
| 2016/0111651 A1 | 4/2016 | Yun et al. | |
| 2016/0126470 A1 | 5/2016 | Ro et al. | |
| 2016/0149132 A1 | 5/2016 | Lim et al. | |
| 2016/0197281 A1 | 7/2016 | Momose et al. | |
| 2016/0254101 A1* | 9/2016 | Forrest | H01L 51/4246 136/256 |
| 2016/0268401 A1 | 9/2016 | Aleksov | |
| 2017/0005142 A1 | 1/2017 | Lee et al. | |
| 2017/0062726 A1 | 3/2017 | Choi et al. | |
| 2017/0074652 A1 | 3/2017 | Send et al. | |
| 2017/0117424 A1 | 4/2017 | Hiroi et al. | |
| 2017/0148994 A1 | 5/2017 | Choi et al. | |
| 2017/0213973 A1 | 7/2017 | Yun et al. | |
| 2017/0294589 A1 | 10/2017 | Shibuya et al. | |
| 2017/0331050 A1 | 11/2017 | Yagi et al. | |
| 2017/0352811 A1 | 12/2017 | Choi et al. | |
| 2018/0151624 A1 | 5/2018 | Hasegawa et al. | |
| 2020/0127232 A1 | 4/2020 | Heo et al. | |

FOREIGN PATENT DOCUMENTS

| | | |
|---|---|---|
| DE | 102004014046 A1 | 9/2004 |
| EP | 0193885 A1 | 9/1986 |
| EP | 0529162 A1 | 3/1993 |
| EP | 0637774 A1 | 2/1995 |
| EP | 2317582 A1 | 5/2011 |
| EP | 3018723 A1 | 5/2016 |
| EP | 3026722 A1 | 6/2016 |
| EP | 3173410 A1 | 5/2017 |
| EP | 3243822 A1 | 11/2017 |
| EP | 3252051 A1 | 12/2017 |
| JP | H06143839 A | 5/1994 |
| JP | H09-311232 A | 12/1997 |
| JP | H1091384 A | 4/1998 |
| JP | 2005-123033 A | 5/2005 |
| JP | 2005-132914 A | 5/2005 |
| JP | 2006-261172 A | 9/2006 |
| JP | 2007/234650 A | 9/2007 |
| JP | 2009-274966 A | 11/2009 |
| JP | 2011-225544 A | 11/2011 |
| JP | 2011/253861 A | 12/2011 |
| JP | 2012-123292 A | 6/2012 |
| JP | 2012-151761 A | 8/2012 |
| JP | 2013-040147 A | 2/2013 |
| JP | 5323025 B2 | 10/2013 |
| JP | 2014-049559 A | 3/2014 |
| JP | 5520560 B2 | 6/2014 |
| JP | 2014-210768 A | 11/2014 |
| JP | 2015-015415 A | 1/2015 |
| JP | 2015-043362 A | 3/2015 |
| JP | 2015/070060 A | 4/2015 |
| JP | 2015-092546 A | 5/2015 |
| KR | 2012-0122847 A | 11/2012 |
| KR | 2014/0106767 A | 9/2014 |
| KR | 10-2015-0066616 A | 6/2015 |
| KR | 2016/0009404 A | 1/2016 |
| KR | 2016/0024686 A | 3/2016 |
| KR | 2016-0041379 A | 4/2016 |
| KR | 2016-0052448 A | 5/2016 |
| KR | 2016-0062708 A | 6/2016 |
| KR | 2017-0027223 A | 3/2017 |
| KR | 2017-0060488 A | 6/2017 |
| KR | 2017-0114839 A | 10/2017 |
| KR | 2017-0126753 A | 11/2017 |
| KR | 2017-0135449 A | 12/2017 |
| KR | 2017-0137648 A | 12/2017 |
| WO | WO-2002-064600 A1 | 8/2002 |
| WO | WO-2008-091670 A2 | 7/2008 |
| WO | WO-2010/011658 A2 | 1/2010 |
| WO | WO-2010/038721 A1 | 4/2010 |
| WO | WO-2014-056886 A1 | 4/2014 |
| WO | WO-2014-157238 A1 | 10/2014 |
| WO | WO-2014/169270 A2 | 10/2014 |

OTHER PUBLICATIONS

U.S. Appl. No. 15/461,914, filed Mar. 17, 2017.
U.S. Office Action dated Jul. 25, 2018 issued in co-pending U.S. Appl. No. 15/272,580.
U.S. Office Action dated Aug. 6, 2018 issued in co-pending U.S. Appl. No. 15/623,801.
Juha Alakarhu. "Image Sensors and Image Quality in Mobile Phones", International Image Sensor Workshop. 2007. pp. 104.
Hokuto Seo et al. "Color Sensors wth Three Vertically Stacked Organic Photodetectors" Japanese Journal of Applied Physics vol. 46, No. 49. The Japan Society of Applied pHysics. 2007. pp. L1240-L1242.
I.G. Hill et al., Organic Electronics, "Metal-dependent charge transfer and chemical interaction at interfaces between 3, 4, 9, 10-perylenetetracarboxylic bisimidazole and gold, silver, and magnesium", vol. 1, Issue 1, Dec. 2000, pp. 5-13.
Marzena Grucela-Zajac et al., "(Photo)physical Properties of New Molecular Glasses End-Capped with Thiphene Rings Composed of Diimide and Imine Units", The Journal of Phyusical Chemistry, May 21, 2014, pp. 13070-13086, ACS Author Choice.
Gorkem Memisoglu et al., "Highly Efficient Organic UV Photodetectors Base don Polyfluorene and Napthalenediimide Blends: Effect of Thermal Annealing", 2012, International Journal of Photoenergy vol. 2012, Article ID 936075, 11 pages, Hindawi Publishing Corporation.
Jiri Misek et al., "A Chiral and Colorful Redox Switch: Enhanced p Acidity in Action", 2010, Angew. Chem. Int. Ed. 2010, 49, 7680-7683, Wiley-VCH Verlag GmbH & Co., KGaA, Weinheim.
European Search Report dated Apr. 26, 2017 issued in corresponding European Application No. 16195944.0.
European Search Report issued in corresponding European Patent Application No. 17150423.6-1555 dated Aug. 4, 2017.
U.S. Notice of Allowance dated Dec. 20, 2017 issued in co-pending U.S. Appl. No. 15/609,125.
U.S. Office Action dated Feb. 14, 2018 issued in co-pending U.S. Appl. No. 15/272,580.
U.S. Office Action dated Jan. 5, 2018 issued in co-pending U.S. Appl. No. 15/362,964.
U.S. Office Action dated Jun. 1, 2018 issued in co-pending U.S. Appl. No. 15/362,964.
U.S. Office Action dated Jul. 3, 2017 ssued in co-pending U.S. Appl. No. 15/255,649.
U.S. Office Action dated Jan. 29, 2018 issued in co-pending U.S. Appl. No. 15/255,649.
U.S. Office Action dated Aug. 24, 2018 issued in co-pending U.S. Appl. No. 15/461,914.
Extended European Search Report dated May 22, 2017, for corresponding European Patent Application No. 17161078.5.
Aihara, Satoshi. "Stacked Image Sensor With Green- and Red-Sensitive Organic Photoconductive Films Applying Zinc Oxide Thin-Film Transistors to a Signal Readout Circuit" IEEE Trans. Electron. Dev., 56(11), 2009, 2570.
Abstract for JP2012-38435 (issued Feb. 23, 2012), retrieved from STN Database, CAPLUS Accession No. 2012:265934, XP002771880.
Extended European Search Report dated Feb. 4, 2019, issued in corresponding European Patent Application No. 18201486.0.
STIC STN Chemical structure search results for Formula 1 (Year: 2021).
U.S. Office Action dated Feb. 14, 2019 issued in corresponding U.S. Appl. No. 15/623,801.
U.S. Notice of Allowance dated Jul. 11, 2019, issued in corresponding U.S. Appl. No. 15/623,801.
Ihama, Mikio. "CMOS Image Sensor with a Thin Overlaid Panchromatic Organic Photoconductive Layer for Sensors with Reduced Pixel" Size IDW '09, INP 1-4.

(56) References Cited

OTHER PUBLICATIONS

Iwaoka, et al. "Possible roles of S O and S N interations in the functions and evolution of phospholipase A2," Biophysics, vol. 2, pp. 23-34 (2006).
Iwaoka, et al. Studies on the Nonbonded Interactions of Divalent Organic Selenium, Department of Chemistry, School of Science, Tokai University, vol. 63, No. 9, pp. 63-72 (2005).
Jen, et al. "Synthesis and Characterization of Highly Efficient and Thermally Stable Diphenylamino-Substituted Thiophene Stilbene Chromophores for Nonlinear Optical Applications," Advanced Materials, . vol. 9, No. 2, pp. 132-135 (1997).
Lim, et al. "Organic-on-silicon complementary metal-oxide-semiconductor colour image sensors," Scientific Reports, vol. 5, pp. 1-7 (2014).
Singh, et al. "Radical Cations of Aromatic Selenium Compounds: Role of Se X Nonbonding Interations," The Journal of Physical Chemistry, vol. 117, pp. 9259-9265 (2013).
U.S. Office Action dated Jan. 7, 2019 issued in corresponding U.S. Appl. No. 15/611,901.
U.S. Office Action dated Apr. 1, 2019 issued in corresponding U.S. Appl. No. 15/611,901.
U.S. Notice of Allowance dated Jun. 19, 2019, issued in corresponding U.S. Appl. No. 15/611,901.
Bulliard, et al. "Dipolar donor-acceptor molecules in the cyanine limit for high efficiency green-light-selective organic photodiodes," Journal of Materials Chemistry C., vol. 4, pp. 1117-1125 (2016).
Heichert, et al. "Synthesis and characterization of long wavelength-absorbing donor/acceptor-substituted methane dyes," Zeitschrift For Naturforschung—Section B, Journal of Chemical Sciences, vol. 71, No. 6, pp. 2-9 (2016).
Matsumoto, et al. "Utilization of Carboxylated 1, 3-Indandione as an Electron Acceptor in Dye-Sensitized Solar Cells," Bulletin of the Chemical Society of Japan, vol. 85, No. 12, pp. 1329-1331 (2012).
Extended European Search Report dated Nov. 2, 2017 issued in corresponding European Patent Application No. 17174434.5.
U.S. Office Action dated Aug. 1, 2018 issued in corresponding U.S. Appl. No. 15/591,259.
U.S. Notice of Allowance dated Jan. 25, 2019, issued in corresponding U.S. Appl. No. 15/591,259.
Jeux, et al. "Miniaturization of molecular conjugated systems for organic solar cells: towards pigmy donors," RCS Adv. vol. 3, pp. 5811-5814 (2013).
Chun, et al. "The effects of the molecular structure if the chromophore on the photorefractive properties of the polymer systems with low glass transition temperatures," J. Mater. Chem., vol. 12, pp. 858-862 (2002).
CAPLUS Abstract (XP-002771879) for Guo, et al. "Acceptors/linkers effects on dye sensitized solar cell: Theoretical investigations of structure-property relationship for design of efficient dye sensitizers," Journal of Theoretical and Computational Chemistry, vol. 13, No. 7, pp. 1-3 (2014).
Kim, et al. "Synthesis and Photovoltaic Performance of Long Wavelength Absorbing Organic Dyes for Dye-Sensitized Solar Cells," Molecular Crystals and Liquid Crystals, vol. 551, No. 1, pp. 283-294 (2011).
CAPLUS Abstract (XP-002771880) for Hamada, et al. "Dye-sensitized photoelectric converter, photoelectrochemical cell, and dye solution for photoelectric converter," Jpn. Kokail Tokkyo Koho, pp. 1-2 (2012).
Yang, et al. "Synthesis and Photovoltaic Properties of Organic Photosensitizers Based on Phenothiazine Chromophore for Application of Dye-Sensitized Solar Cells," Molecular Crystals and Liquid Crystals, vol. 538, No. 1, pp. 149-156 (2011).
Extended European Search Report dated Jul. 19, 2017 issued in corresponding European Application No. 17170200.4.
U.S. Office Action dated Oct. 2, 2020, issued in corresponding U.S. Appl. No. 16/165,005.
U.S. Notice of Allowance dated Feb. 8, 2021, issued in corresponding U.S. Appl. No. 16/165,005.
U.S. Notice of Allowance dated Jun. 11, 2021, issued in corresponding U.S. Appl. No. 16/165,005.
Drechsel J. et al: "Efficient organic solar cells based on a double p-i-n architecture using doped wide-gap transport layers", Applied Physics Letters, AIP Publishing LLC, US, vol. 86, No. 24, Jun. 7, 2005 (Jun. 7, 2005), pp. 244102-244102, XP012065900, ISSN: 0003-6951, DOI: 10.1063/1.1935771.
European Search Report for Application No. 171770027 dated Nov. 17, 2017.

* cited by examiner

ORGANIC PHOTOELECTRONIC DEVICE AND IMAGE SENSOR

CROSS-REFERENCE TO RELATED APPLICATION

This application claims priority to and the benefit of Korean Patent Application No. 10-2016-0081554 filed in the Korean Intellectual Property Office on Jun. 29, 2016, the entire contents of which are incorporated herein by reference.

BACKGROUND

1. Field

Example embodiments provide an organic photoelectronic device and an image sensor including the same.

2. Description of the Related Art

A photoelectronic device may convert light into an electrical signal using photoelectric effects. A photoelectronic device may include a photodiode, a phototransistor, etc. A photoelectronic device may be applied to (e.g., included in) various devices, including image sensors, a solar cell, an organic light emitting diode, some combination thereof, etc.

An image sensor including a photodiode requires relatively high resolution and thus a smaller pixel. At present, a silicon photodiode is widely used. In some cases, a silicon photodiode exhibits a problem of deteriorated sensitivity because of a relatively small absorption area due to relatively small pixels. Accordingly, an organic material that is capable of replacing silicon has been researched.

An organic material has a relatively high extinction coefficient and selectively absorbs light in a particular wavelength region depending on a molecular structure, and thus may simultaneously replace a photodiode and a color filter and resultantly improve sensitivity and contribute to relatively high integration.

SUMMARY

Example embodiments provide an organic photoelectronic device capable of increasing wavelength selectivity.

Example embodiments also provide an image sensor including the organic photoelectronic device.

Example embodiments also provide an electronic device including the image sensor.

According to example embodiments, an organic photoelectronic device includes a first electrode and a second electrode facing each other and a light-absorption layer between the first electrode and the second electrode and including a p-type light-absorbing material and an n-type light-absorbing material, wherein at least one of the p-type light-absorbing material and the n-type light-absorbing material selectively absorbs a part of visible light, and the light-absorption layer includes a photoelectric conversion region including the p-type light-absorbing material and the n-type light-absorbing material and a doped region including at least one of the p-type light-absorbing material and the n-type light-absorbing material, and an exciton quencher.

The photoelectric conversion region may include a first photoelectric conversion region near to the first electrode and a second photoelectric conversion region near to the second electrode, and the doped region is between the first photoelectric conversion region and the second photoelectric conversion region.

The second electrode may be nearer to light incidence side than the first electrode, and a thickness of the second photoelectric conversion region may be the same as or larger than a thickness of the first photoelectric conversion region.

The exciton quencher may include a metal, a semi-metal, a metal oxide, a semi-metal oxide, an organic material, or a combination thereof.

The exciton quencher may include a hole transportable metal, a hole transportable semi-metal, a hole transportable metal oxide, a hole transportable semi-metal oxide, a hole transportable organic material, or a combination thereof.

The exciton quencher may include copper, silver, gold, aluminum, a molybdenum oxide, a tungsten oxide, a vanadium oxide, a rhenium oxide, a nickel oxide, or a combination thereof.

The exciton quencher may be included in an amount of less than or equal to about 50 volume % based on the amount of the doped region.

At least one of the p-type light-absorbing material and the n-type light-absorbing material may selectively absorb at least one of a wavelength of greater than or equal to about 400 nm and less than 500 nm, a wavelength region of about 500 nm to about 600 nm, and a wavelength region of greater than about 600 nm and less than or equal to about 700 nm.

The light-absorption layer may absorb first visible light and second visible light that are different wavelength regions from each other, and the first visible light may be absorbed at maximum in the photoelectric conversion region and the second visible light may be absorbed at maximum in the doped region.

One of the p-type light-absorbing material and the n-type light-absorbing material may selectively absorb the first visible light and the other of the p-type light-absorbing material and the n-type light-absorbing material may absorb the first visible light and the second visible light.

The first visible light may be a wavelength region of about 500 nm to about 600 nm and the second visible light may be a wavelength of greater than or equal to about 400 nm and less than 500 nm.

External quantum efficiency of the organic photoelectronic device for the first visible light and the second visible light may satisfy Relationship Equation 1.

$$EQE_{max}/EQE_{450\,nm} \geq 3.80 \qquad \text{[Relationship Equation 1]}$$

In Relationship Equation 1, $EQE_{max}$ is external quantum efficiency of the first visible light at a maximum absorption wavelength which is measured using an incident photon to current efficiency (IPCE), and $EQE_{450\,nm}$ is external quantum efficiency at 450 nm which is measured using an incident photon to current efficiency (IPCE).

The p-type light-absorbing material may selectively absorb the first visible light and the n-type light-absorbing material may absorb the first visible light and the second visible light.

The n-type light-absorbing material may be fullerene or a fullerene derivative.

The p-type light-absorbing material may be an organic material including a core structure including an electron donating moiety, a pi conjugation linking group, and an electron accepting moiety.

The p-type light-absorbing material may be a compound represented by Chemical Formula 1.

[Chemical Formula 1]

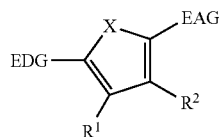

In Chemical Formula 1,
X is Se, Te, SO, $SO_2$, or $SiR^aR^b$,
EDG is an electron donating group,
EAG is an electron accepting group, and
$R^1$, $R^2$, $R^a$, and $R^b$ are independently hydrogen or a monovalent substituent.

The p-type light-absorbing material may be a compound represented by Chemical Formula 1A or 1B.

[Chemical Formula 1A]

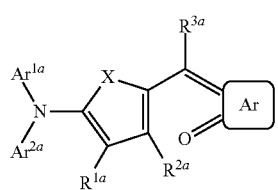

[Chemical Formula 1B]

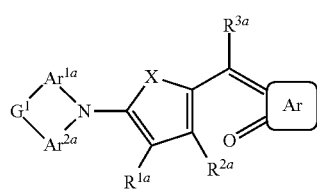

In Chemical Formula 1A or 1B,
X is Se, Te, SO, $SO_2$, or $SiR^aR^b$,
Ar is a substituted or unsubstituted 5-membered ring, a substituted or unsubstituted 6-membered ring, or a condensed ring of the two or more foregoing rings,
each of $Ar^{1a}$ and $Ar^{2a}$ are independently a substituted or unsubstituted $C_6$ to $C_{30}$ aryl group or a substituted or unsubstituted $C_3$ to $C_{30}$ heteroaryl group,
$G^1$ is selected from a single bond, $-(CR^gR^h)_{n2}-$, $-O-$, $-S-$, $-Se-$, $-N=$, $-NR^i-$, $-SiR^jR^k-$, and $-GeR^lR^m-$, wherein n2 is 1 or 2, and
each of $R^{1a}$ to $R^{3a}$, $R^a$, and $R^b$ are independently hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a substituted or unsubstituted $C_1$ to $C_6$ alkoxy group, halogen, or a cyano group.

The p-type light-absorbing material may be a compound represented by one of Chemical Formulae 1A-1 to 1B-4.

[Chemical Formula 1A-1]

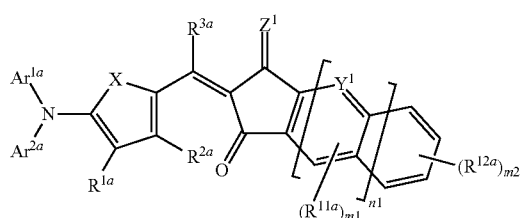

[Chemical Formula 1A-2]

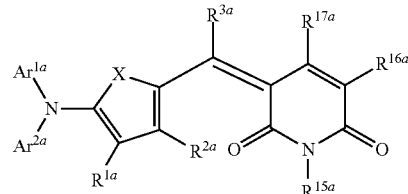

[Chemical Formula 1A-3]

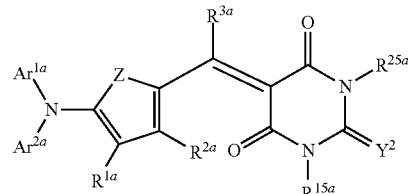

[Chemical Formula 1A-4]

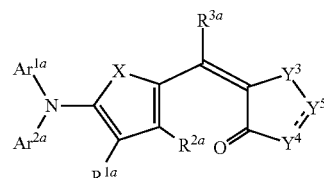

[Chemical Formula 1B-1]

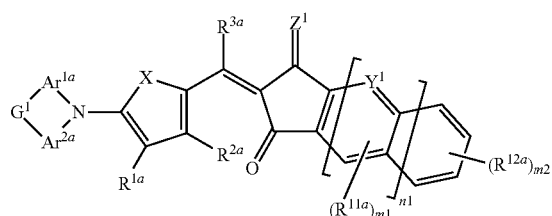

[Chemical Formula 1B-2]

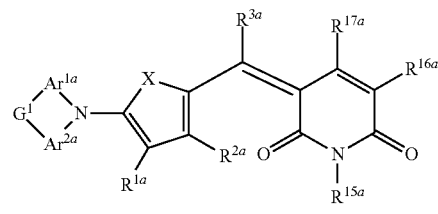

[Chemical Formula 1B-3]

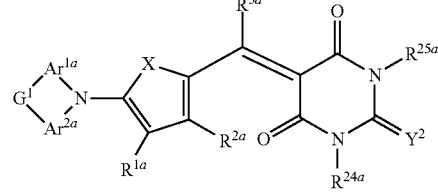

[Chemical Formula 1B-4]

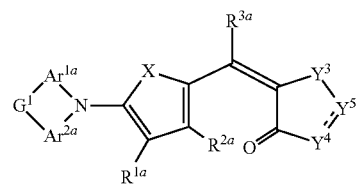

In Chemical Formulae 1A-1 to 1B-4,

X is Se, Te, SO, $SO_2$, or $SiR^aR^b$, $Z^1$ is O or $CR^cR^d$, $Y^1$ is N or $CR^e$, $Y^2$ is selected from O, S, Se, Te, and $C(R^f)(CN)$, $Y^3$ is O, S, Se, or Te, $Y^4$ is N or $NR^{18a}$, $Y^5$ is $CR^{19a}$ or $C=CR^{20a}(CN)$, each of $Ar^{1a}$ and $Ar^2a$ are independently a substituted or unsubstituted $C_6$ to $C_{30}$ aryl group or a substituted or unsubstituted $C_3$ to $C_{30}$ heteroaryl group, each of $R^{1a}$ to $R^{3a}$, $R^{11a}$, $R^{12a}$, $R^{15a}$ to $R^{20a}$, $R^{24a}$, $R^{25a}$, and $R^a$ to $R^f$ are independently hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a substituted or unsubstituted $C_1$ to $C_6$ alkoxy group, a halogen, or a cyano group, n1 is 0 or 1, m1 is 0 or 1, and m2 is an integer of 0 to 4.

According to example embodiments, an image sensor includes the organic photoelectronic device.

According to example embodiments, an electronic device includes the image sensor.

DETAILED DESCRIPTION

Figure 1:
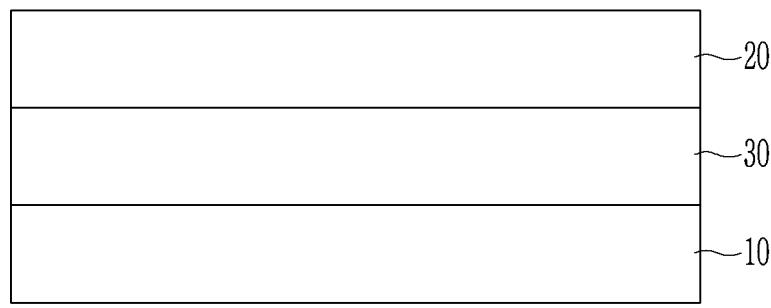
FIG. 1 is a cross-sectional view showing an organic photoelectronic device according to example embodiments.

Example embodiments will hereinafter be described in detail, and may be easily performed by those who have common knowledge in the related art. However, this disclosure may be embodied in many different forms and is not to be construed as limited to the example embodiments set forth herein.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Although the terms "first," "second," "third," etc., may be used herein to describe various elements, components, regions, layers, and/or sections, these elements, components, regions, layers, and/or sections, should not be limited by these terms. These terms are only used to distinguish one element, component, region, layer, or section, from another region, layer, or section. Thus, a first element, component, region, layer, or section, discussed below may be termed a second element, component, region, layer, or section, without departing from the scope of this disclosure.

Spatially relative terms, such as "beneath," "below," "lower," "under," "above," "upper," etc., may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below," "beneath," or "under," other elements or features would then be oriented "above" the other elements or features. Thus, the example terms "below" and "under" may encompass both an orientation of above and below. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

As used herein, the singular forms "a," "an," and "the," are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups, thereof. As used herein, the term "and/or" includes any and all combinations of one or more of the associated listed items. Expressions such as "at least one of," when preceding a list of elements, modify the entire list of elements and do not modify the individual elements of the list. Also, the term "exemplary" is intended to refer to an example or illustration.

When an element is referred to as being "on," "connected to," "coupled to," or "adjacent to," another element, the element may be directly on, connected to, coupled to, or adjacent to, the other element, or one or more other intervening elements may be present. In contrast, when an element is referred to as being "directly on," "directly connected to," "directly coupled to," or "immediately adjacent to," another element, there are no intervening elements present.

Unless otherwise defined, all terms (including technical and scientific terms) used herein have the same meaning as commonly understood by one of ordinary skill in the art to which example embodiments belong. Terms, such as those defined in commonly used dictionaries, should be interpreted as having a meaning that is consistent with their meaning in the context of the relevant art and/or this disclosure, and should not be interpreted in an idealized or overly formal sense unless expressly so defined herein.

In the drawings, parts having no relationship with the description are omitted for clarity of the embodiments, and the same or similar constituent elements are indicated by the same reference numerals throughout the specification.

Hereinafter, an organic photoelectronic device according to example embodiments is described with reference to drawings.

Figure 2:
FIG. 2 is a cross-sectional view showing one example of the organic photoelectronic device of FIG. 1.

FIG. 1 is a cross-sectional view showing an organic photoelectronic device according to example embodiments, and FIG. 2 is a cross-sectional view showing one example of the organic photoelectronic device of FIG. 1.

Referring to FIG. 1, an organic photoelectronic device 100 according to example embodiments includes a first electrode 10 and a second electrode 20 facing each other and a light-absorption layer 30 between the first electrode 10 and the second electrode 20.

One of the first electrode 10 and the second electrode 20 is an anode, and the other is a cathode. At least one of the first electrode 10 and second electrode 20 may be a light-transmitting electrode, and the light-transmitting electrode may at least partially comprise, for example, a transparent conductor including an indium tin oxide (ITO) or an indium zinc oxide (IZO), or a metal thin layer of a thin monolayer or multilayer. When one of the first electrode 10 and the second electrode 20 is a non-light-transmitting electrode, the first electrode 10 or the second electrode 20 may at least partially comprise, for example, an opaque conductor such as aluminum (Al).

For example, the first electrode 10 and the second electrode 20 are light-transmitting electrodes.

The light-absorption layer 30 includes a p-type light-absorbing material and an n-type light-absorbing material and thereby absorbs light in a given or predetermined wavelength region to generate excitons and then to separate the generated excitons into holes and electrons.

At least one of the p-type light-absorbing material and the n-type light-absorbing material selectively absorbs a part of visible light, and for example at least one of the p-type light-absorbing material and the n-type light-absorbing material may selectively absorb light of one of a wavelength of greater than or equal to about 400 nm and less than 500 nm, a wavelength region of about 500 nm to about 600 nm, and a wavelength region of greater than about 600 nm and less than or equal to about 700 nm. That is, at least one of the p-type light-absorbing material and the n-type light-absorbing material may selectively absorb one of green light, blue light, and red light.

For example, one of the p-type light-absorbing material and the n-type light-absorbing material may selectively absorb one of green light, blue light, and red light, and the other of the p-type light-absorbing material and the n-type light-absorbing material may absorb two or more of green light, blue light, and red light.

For example, one of the p-type light-absorbing material and the n-type light-absorbing material may selectively absorb green light, and the other of the p-type light-absorbing material and the n-type light-absorbing material may absorb blue light and/or red light as well as green light.

For example, one of the p-type light-absorbing material and the n-type light-absorbing material may selectively absorb red light, and the other of the p-type light-absorbing material and the n-type light-absorbing material may absorb blue light and/or green light as well as red light.

For example, one of the p-type light-absorbing material and the n-type light-absorbing material may selectively absorb blue light, and the other of the p-type light-absorbing material and the n-type light-absorbing material may absorb red light and/or green light as well as blue light.

For example, the p-type light-absorbing material may selectively absorb green light, and the n-type light-absorbing material may absorb blue light and/or red light as well as green light.

For example, the n-type light-absorbing material may selectively absorb green light, and the p-type light-absorbing material may absorb blue light and/or red light as well as green light.

For example, the p-type light-absorbing material may selectively absorb red light, and the n-type light-absorbing material may absorb blue light and/or green light as well as red light.

For example, the n-type light-absorbing material may selectively absorb red light, and the p-type light-absorbing material may absorb blue light and/or green light as well as red light.

For example, the p-type light-absorbing material may selectively absorb blue light, and the n-type light-absorbing material may absorb green light and/or red light as well as blue light.

For example, the n-type light-absorbing material may selectively absorb blue light, and the p-type light-absorbing material may absorb green light and/or red light as well as blue light.

The light-absorption layer 30 includes a photoelectric conversion region that generates excitons by light in given or predetermined wavelength region absorbed by the p-type light-absorbing material and the n-type light-absorbing material, and then separates the generated excitons into holes and electrons.

The light-absorption layer 30 includes a doped region including an exciton quencher that reduces or suppresses photoelectric conversion. The doped region may be disposed inside the light-absorption layer 30, for example, between the photoelectric conversion regions.

The doped region of the light-absorption layer 30 may include at least one of a p-type light-absorbing material and an n-type light-absorbing material on which the exciton quencher is doped. For example, the doped region of the light-absorption layer 30 may include a p-type light-absorbing material and an exciton quencher. For example, the doped region of the light-absorption layer 30 may include an n-type light-absorbing material and an exciton quencher. For example, the doped region of the light-absorption layer 30 may include a p-type light-absorbing material, an n-type light-absorbing material, and an exciton quencher. The exciton quencher may be included in an amount of less than or equal to about 50 volume %, for example about 0.1 volume % to about 50 volume %, about 1 volume % to about 40 volume %, about 5 volume % to about 40 volume % based on the doped region.

The exciton quencher is not particularly limited as long as it may reduce and/or suppress generation of excitons or reduce and/or suppress activity of excitons by removing energy from excitons, and may be, for example a metal, a semi-metal, a metal oxide, a semi-metal oxide, an organic material, or a combination thereof.

The exciton quencher may be, for example a hole transportable exciton quencher, for example a hole transportable metal, a hole transportable semi-metal, a hole transportable metal oxide, a hole transportable semi-metal oxide, a hole transportable organic material, or a combination thereof. Herein, hole transporting capability refers to characteristics to donate electrons by receiving light and to form or transport holes, and to have conduction characteristics along a HOMO energy level and to make holes be transferred easily. The hole transportable exciton quencher may have, for example a work function of greater than or equal to about 4.5 eV or a HOMO energy level of greater than or equal to about 5.0 eV, but is not limited thereto.

The exciton quencher may be, for example, copper, silver, gold, aluminum, a molybdenum oxide, a tungsten oxide, a vanadium oxide, a rhenium oxide, a nickel oxide, or a combination thereof, but is not limited thereto.

The exciton quencher may be, for example an electron transportable exciton quencher and may be, for example an electron transportable metal, an electron transportable semi-metal, an electron transportable metal oxide, an electron transportable semi-metal oxide, an electron transportable organic material, or a combination thereof. Herein, electron transporting capability refers to characteristics to accept electrons by receiving light and to have conduction characteristics along an LUMO energy level and to make electrons be transferred easily. The electron transportable exciton quencher may be, for example a material having a work function of less than about 4.5 eV or an LUMO energy level of less than or equal to about 4.5 eV, but is not limited thereto.

The exciton quencher may be, for example a manganese oxide, a titanium oxide, a zinc oxide, or a combination thereof, but is not limited thereto.

For example, referring to FIG. 2, the light-absorption layer 30 may include a first photoelectric conversion region 30a near to the first electrode 10, a second photoelectric conversion region 30b near to the second electrode 20, and a doped region 30c disposed between the first photoelectric conversion region 30a and the second photoelectric conversion region 30b. That is, the first photoelectric conversion region 30a, the doped region 30c, and the second photoelectric conversion region 30b may be sequentially disposed along a thickness direction of the light-absorption layer 30.

The first photoelectric conversion region 30a and the second photoelectric conversion region 30b may respectively include a p-type light-absorbing material and an n-type light-absorbing material, and the p-type light-absorbing material and the n-type light-absorbing material may be mixed in a form of a bulk heterojunction. The first photoelectric conversion region 30a and the second photoelectric conversion region 30b may respectively include, a p-type light-absorbing material and an n-type light-absorbing material in a volume ratio of, for example, about 1:10 to about 10:1, about 2:8 to about 8:2, about 3:7 to about 7:3, or about 4:6 to about 6:4.

The doped region 30c may include at least one of the p-type light-absorbing material and the n-type light-absorbing material, and an exciton quencher. For example, the doped region 30c may include a mixture of the p-type light-absorbing material and the exciton quencher. For example, the doped region 30c may include a mixture of the n-type light-absorbing material and the exciton quencher. For example, the doped region 30c may include a mixture of the p-type light-absorbing material, the n-type light-absorbing material, and the exciton quencher. When the doped region 30c includes the p-type light-absorbing material, the n-type light-absorbing material, and the exciton quencher, in the doped region 30c, a composition ratio of the p-type light-absorbing material and the n-type light-absorbing material may be the same as in the first photoelectric conversion region 30a and the second photoelectric conversion region 30b. The exciton quencher may be included in an amount of less than or equal to about 50 volume %, for example about 0.1 volume % to about 50 volume %, about 1 volume % to about 40 volume %, about 5 volume % to about 40 volume % based on the doped region 30c.

The doped region 30c may have a thickness of about 1 nm to about 50 nm, for example about 5 nm to about 40 nm, or about 10 nm to about 30 nm.

A sum of thicknesses of the first photoelectric conversion region 30a and the second photoelectric conversion region 30b may be greater than a thickness of the doped region 30c. The thicknesses of the first photoelectric conversion region 30a and the second photoelectric conversion region 30b are not particularly limited, and for example a photoelectric conversion region near to a light receiving side may have a sufficient thickness. For example, when the second electrode 20 is nearer than the first electrode 10 to a light receiving side, a thickness of the second photoelectric conversion region 30b may be the same or greater than that of the first photoelectric conversion region 30a.

The doped region 30c includes the exciton quencher and thereby activity of excitons generated the p-type light-absorbing material and/or the n-type light-absorbing material in the doped region 30c may be reduced and/or suppressed to reduce photoelectric conversion efficiency of absorbed light in the doped region 30c.

The light-absorption layer 30 may mainly absorb light in different wavelength regions depending on a position, for example, along the thickness direction. For example, green light may be mainly absorbed in a near region to the incident side of the light-absorption layer 30, and blue light may be mainly absorbed in a middle region of the light-absorption layer 30.

In example embodiments, considering that a light-absorbing region of the light-absorption layer 30 varies depending on a visible ray wavelength region, the doped region 30c including an exciton quencher may be formed in a region mainly absorbing light of an undesired region to decrease photoelectric conversion efficiency in the undesired wavelength region and thus increase wavelength selectivity of an organic photoelectronic device.

For example, when the light-absorption layer 30 mainly absorbs green light of an about 500 nm to about 600 nm wavelength region, which is a desired wavelength region, the light of the about 500 nm to about 600 nm wavelength region is absorbed at most in the first and second photoelectric conversions region 30a and 30b, and light of the other wavelength regions may be absorbed at most in the doped region 30c.

Specifically, external quantum efficiency (EQE) of the organic photoelectronic device 100 may be proportional to absorbance and internal quantum efficiency (IQE) of the light-absorption layer 30, and the internal quantum efficiency (IQE) may be classified into charge separation efficiency (CS) and charge collection efficiency (CC).

In example embodiments, absorbance and charge separation efficiency of light of a desired wavelength region may be secured by including a p-type light-absorbing material and an n-type light-absorbing material in a composition ratio capable of exerting an optimal efficiency in a region absorbing the light of the desired wavelength region, and simultaneously, charge separation efficiency of light of an undesired wavelength region may be decreased by forming the doped region 30c where an exciton quencher is doped in a region absorbing the light of the undesired region. Accordingly, external quantum efficiency (EQE) of the light of the desired wavelength region may be secured, and simultaneously, wavelength selectivity of the light of the undesired wavelength region may be increased.

On the other hand, the exciton quencher may have charge transfer characteristics like the hole transportable exciton quencher or an electron transportable exciton quencher as described above. Accordingly, the exciton quencher may increase mobility of holes separated from the first and second photoelectric conversion regions 30a and 30b toward an anode, either one of the first electrode 10 and second electrode 20, while the holes are passing the doped region 30c and also, mobility of electrons separated from the first and second photoelectric conversion regions 30a and 30b toward a cathode, either one of the first electrode 10 and the second electrode 20, while the electrons are passing the doped region 30c. In particular, when the exciton quencher is a hole transportable exciton quencher, mobility between the electrons and the holes in the light-absorption layer 30 may be balanced by increasing mobility of the holes generally having lower mobility than electrons.

Accordingly, the organic photoelectronic device according to example embodiments may realize relatively high efficiency by increasing charge mobility as well as wavelength selectivity.

For example, the wavelength selectivity may be for example calculated as an external quantum efficiency (EQE) ratio of light of a desired wavelength region and light of an undesired wavelength region. For example, when the light-absorption layer 30 is a green light-absorption layer that mainly absorbs light in a wavelength region of about 500 nm to about 600 nm and one of the p-type light-absorbing material and the n-type light-absorbing material selectively absorbs first visible light in a wavelength region of about 500 nm to about 600 nm and the other of the p-type light-absorbing material and the n-type light-absorbing material absorbs second visible light in a wavelength region of greater than or equal to about 400 nm and less than about 500 nm as well as the first visible light in a wavelength region of about 500 nm to about 600 nm, external quantum efficiency of the organic photoelectronic device for the first visible light and the second visible light may satisfy Relationship Equation 1.

$$EQE_{max}/EQE_{450\ nm} \geq 3.80 \quad \text{[Relationship Equation 1]}$$

In Relationship Equation 1, $EQE_{max}$ is external quantum efficiency of the first visible light at a maximum absorption wavelength which is measured using an incident photon to current efficiency (IPCE), and $EQE_{450\ nm}$ is external quantum efficiency at 450 nm which is measured using an incident photon to current efficiency (IPCE).

For example, within the range, for example it may satisfy Relationship Equation 1a.

$$EQE_{max}/EQE_{450\ bm} \geq 3.85 \quad \text{[Relationship Equation 1a]}$$

For example, within the range, for example it may satisfy Relationship Equation 1b.

$$EQE_{max}/EQE_{450\ nm} \geq 4.00 \quad \text{[Relationship Equation 1 b]}$$

For example, wavelength selectivity may be expressed as a full width at half maximum (FWHM). The full width at half maximum (FWHM) refers to a width of a wavelength corresponding to half of a maximum absorption point in a light absorption curve depending on a wavelength, and may be for example defined by absorbance measured by UV-Vis spectroscopy. The light-absorption layer 30 may have, for example a full width at half maximum (FWHM) of less than about 110 nm, for example less than or equal to about 105 nm or less than or equal to about 100 nm.

For example, the p-type light-absorbing material of the light-absorption layer 30 may selectively absorb the first visible light in a wavelength region of about 500 nm to about 600 nm and the n-type light-absorbing material may absorb the first visible light in a wavelength region of about 500 nm to about 600 nm and the second visible light in a wavelength region of greater than or equal to about 400 nm and less than about 500 nm.

For example, the p-type light-absorbing material of the light-absorption layer 30 may be, for example quinacridone or a derivative thereof, sub-phthalocyanine or a derivative thereof and the n-type light-absorbing material may be fullerene or a fullerene derivative.

For example, the p-type light-absorbing material of the light-absorption layer 30 is for example an organic material having a core structure including an electron donating moiety, a pi conjugation linking group, and an electron accepting moiety, and the n-type light-absorbing material may be fullerene or a fullerene derivative.

For example, the p-type light-absorbing material of the light-absorption layer 30 may be, for example a compound represented by Chemical Formula 1.

[Chemical Formula 1]

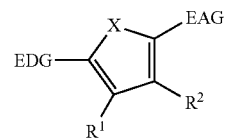

In Chemical Formula 1,
X is Se, Te, SO, SO$_2$, or SiR$^a$R$^b$,
EDG is an electron donating group,
EAG is an electron accepting group, and
R$^1$, R$^2$, R$^a$, and R$^b$ are independently hydrogen or a monovalent substituent.

The p-type light-absorbing material may be, for example a compound represented by Chemical Formula 1A or 1B.

[Chemical Formula 1A]

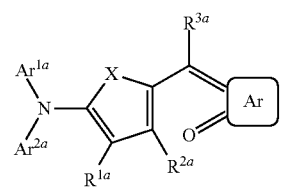

[Chemical Formula 1B]

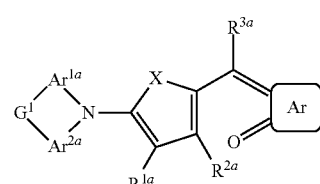

In Chemical Formula 1A or 1B,
X is Se, Te, SO, SO$_2$, or SiR$^a$R$^b$,
Ar is a substituted or unsubstituted 5-membered ring, a substituted or unsubstituted 6-membered ring, or a condensed ring of the two or more foregoing rings,
Ar$^{1a}$ and Ar$^{2a}$ are independently a substituted or unsubstituted C$_6$ to C$_{30}$ aryl group or a substituted or unsubstituted C$_3$ to C$_{30}$ heteroaryl group, $G^1$ is selected from a single bond, $-(CR^gR^h)_{n2}-$, $-O-$, $-S-$, $-Se-$, $-N=$, $-NR^i-$, $-SiR^jR^k-$, and $-GeR^lR^m-$, wherein n2 is 1 or 2, and each of $R^{1a}$ to $R^{3a}$, $R^a$, and $R^b$ are independently hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a substituted or unsubstituted $C_1$ to $C_6$ alkoxy group, halogen, or a cyano group.

The p-type light-absorbing material may be, for example a compound represented by one of Chemical Formulae 1A-1 to 1A-4.

each of $R^{1a}$ to $R^{3a}$, $R^{11a}$, $R^{12a}$, $R^{15a}$ to $R^{20a}$, $R^{24a}$, $R^{25a}$, and $R^a$ to $R^f$ are independently hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a substituted or unsubstituted $C_1$ to $C_6$ alkoxy group, a halogen, or a cyano group, and n1 is 0 or 1, m1 is 0 or 1, and m2 is an integer of 0 to 4.

The compound represented by one of Chemical Formulae 1A-1 to 1A-4 may be, for example compounds of Group 1, but is not limited thereto.

[Chemical Formula 1A-1]

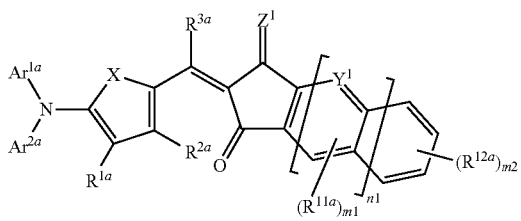

[Chemical Formula 1A-2]

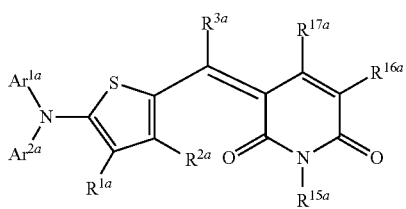

[Chemical Formula 1A-3]

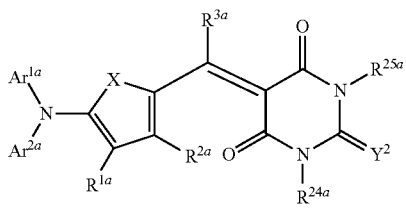

[Chemical Formula 1A-4]

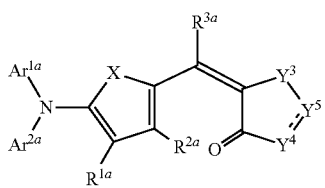

In Chemical Formulae 1A-1 to 1A-4,
X is Se, Te, SO, $SO_2$, or $SiR^aR^b$,
$Z^1$ is O or $CR^cR^d$,
$Y^1$ is N or $CR^e$,
$Y^2$ is selected from O, S, Se, Te, and $C(R^f)(CN)$,
$Y^3$ is O, S, Se, or Te,
$Y^4$ is N or $NR^{18a}$,
$Y^5$ is $CR^{19a}$ or $C=CR^{20a}(CN)$,
each of $Ar^{1a}$ and $Ar^{2a}$ are independently a substituted or unsubstituted $C_6$ to $C_{30}$ aryl group or a substituted or unsubstituted $C_3$ to $C_{30}$ heteroaryl group,

[Group 1]

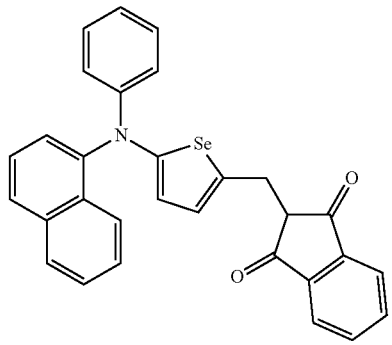

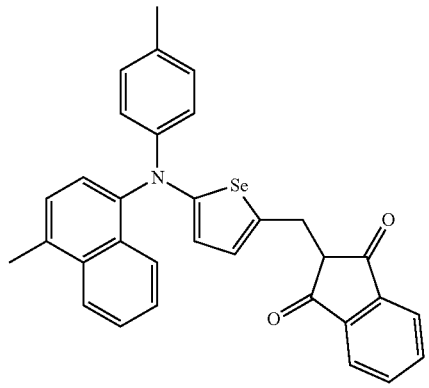

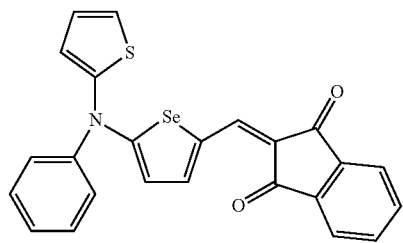

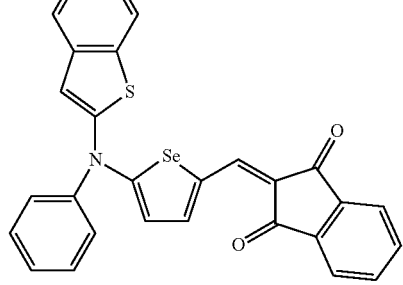

15
-continued
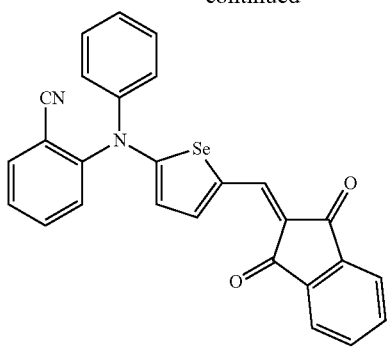
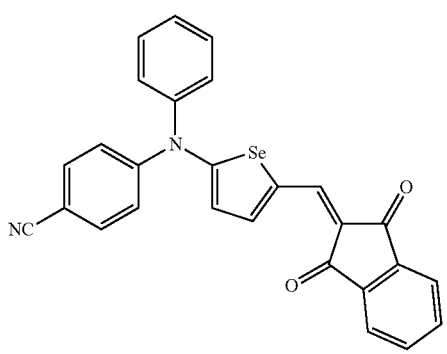
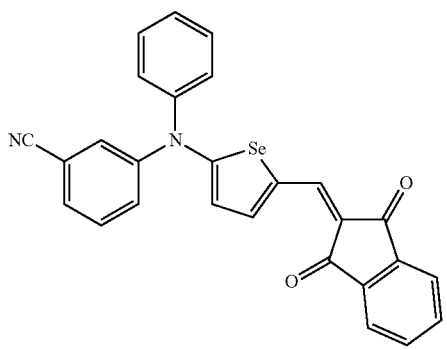
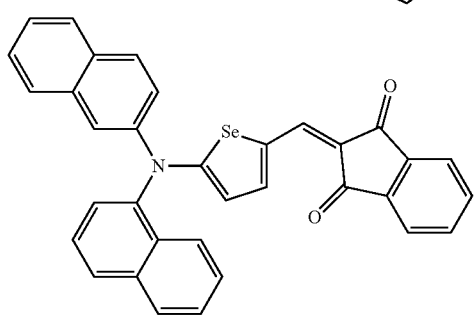
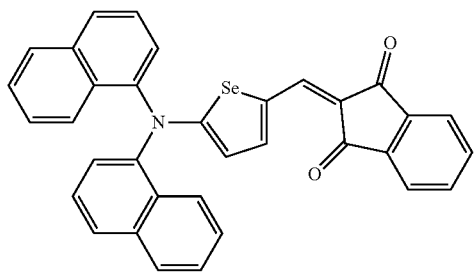
16
-continued
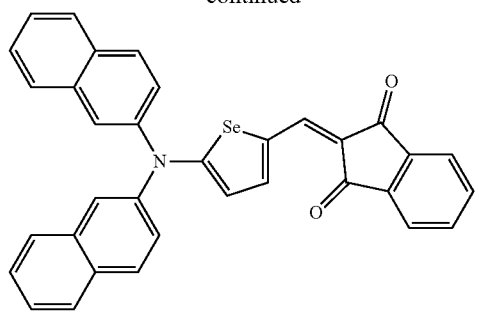
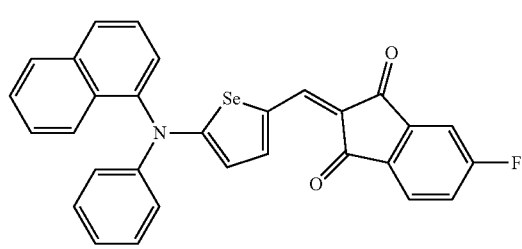
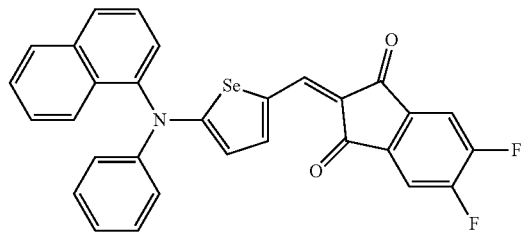
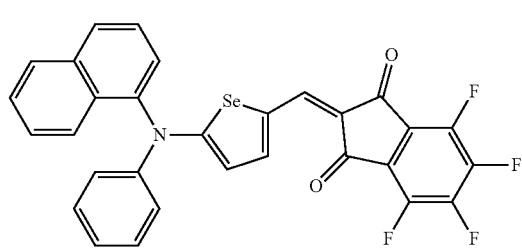
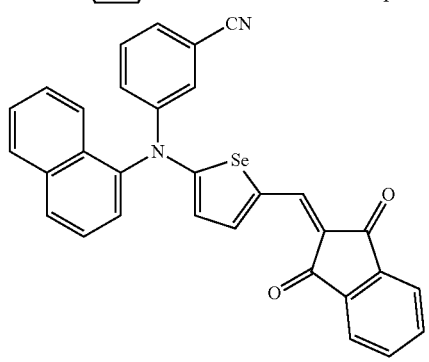

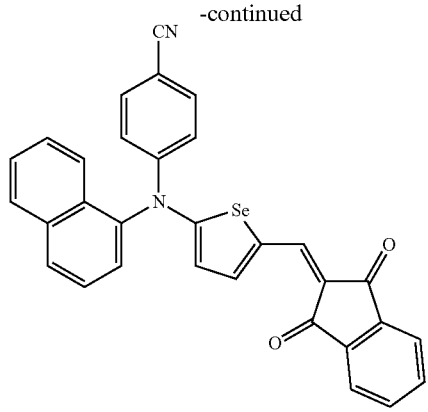
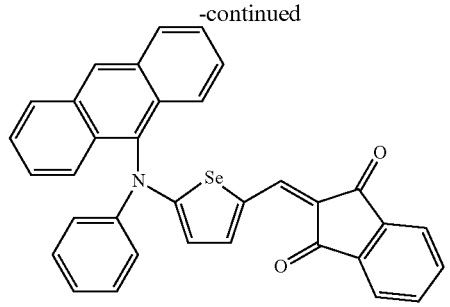
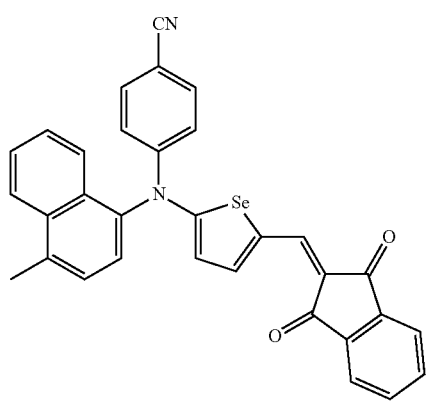
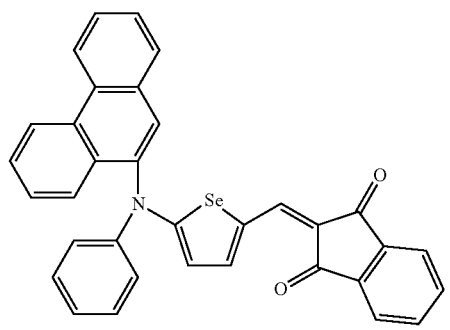
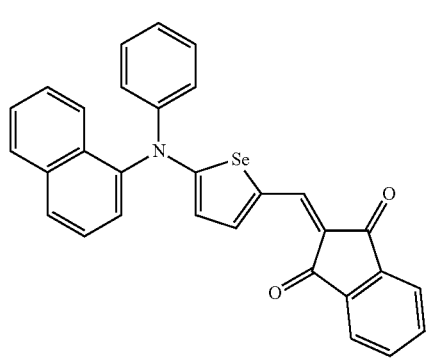
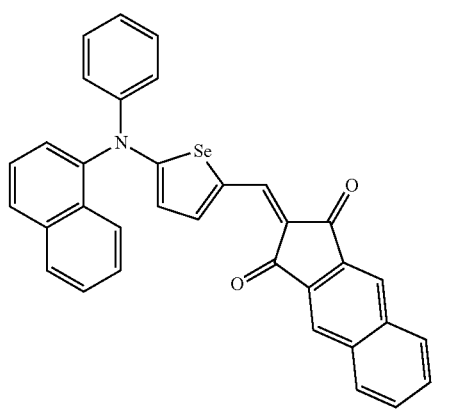
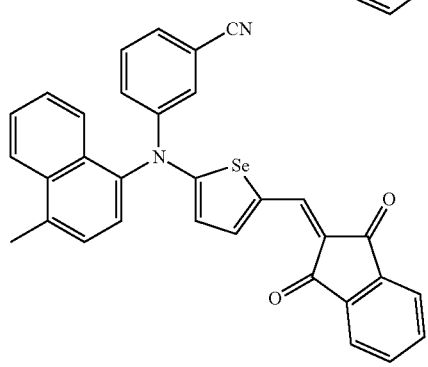
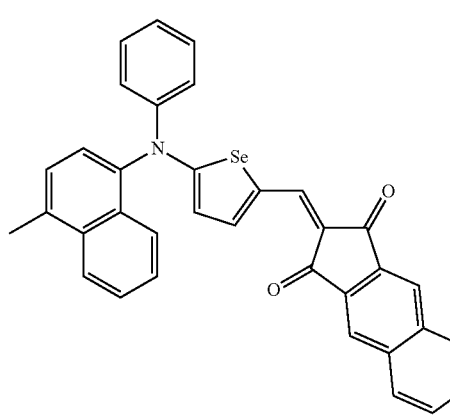

-continued
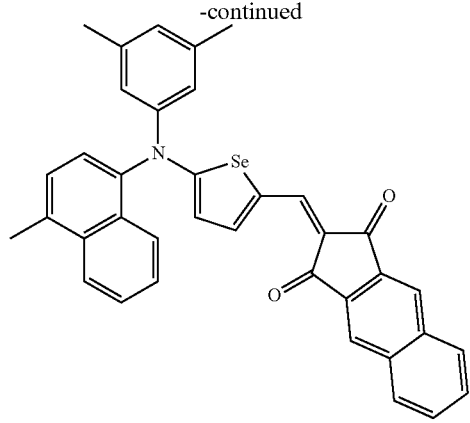
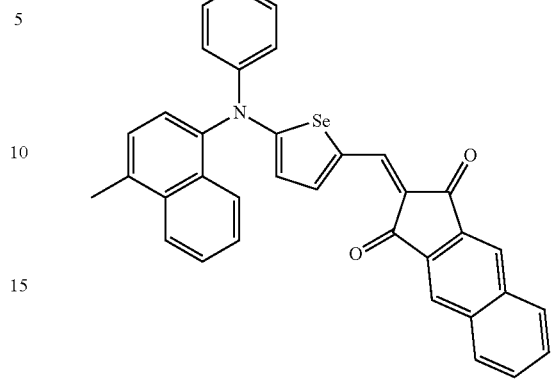
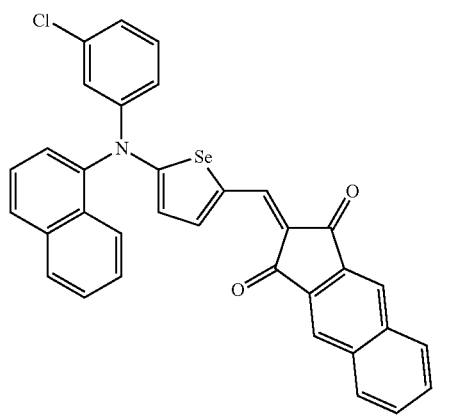
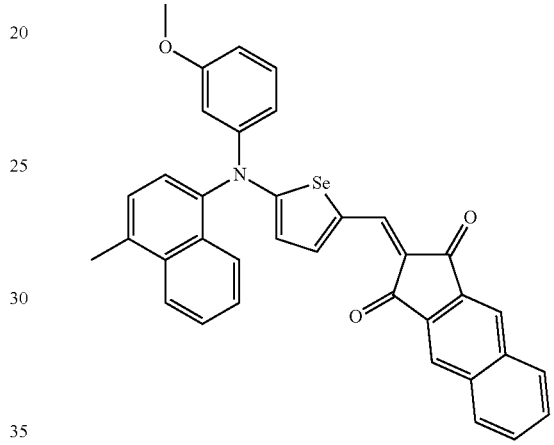
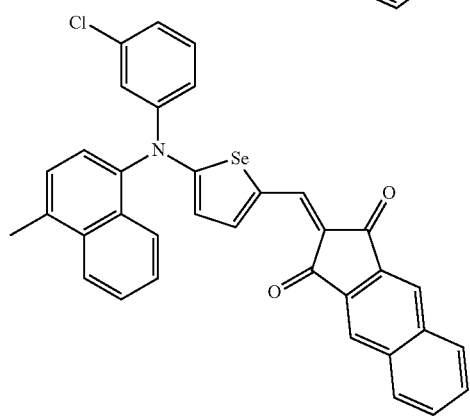
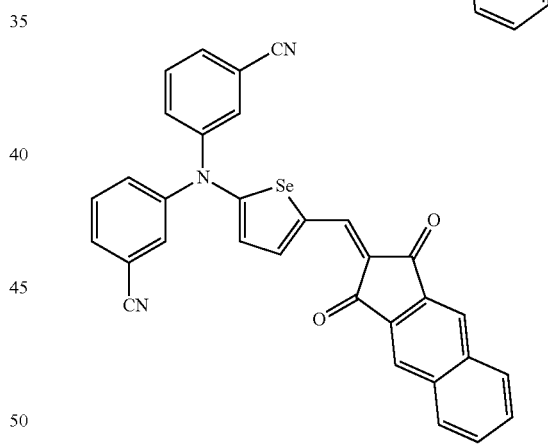
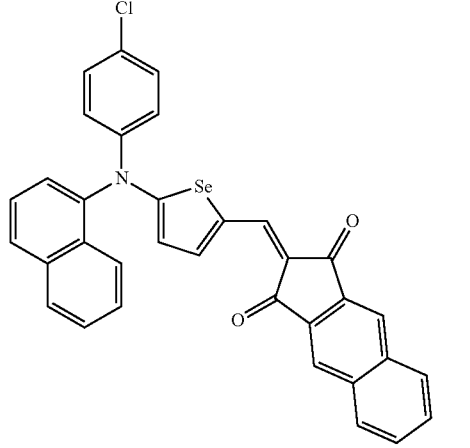
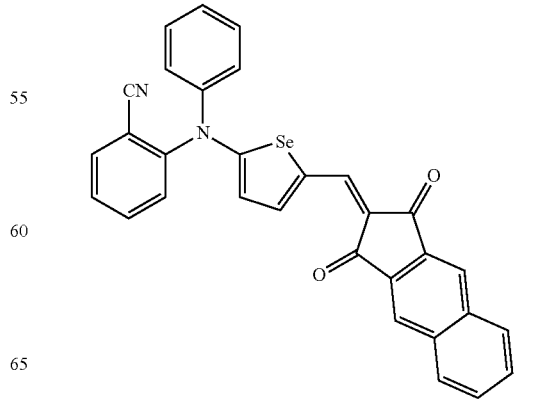

-continued
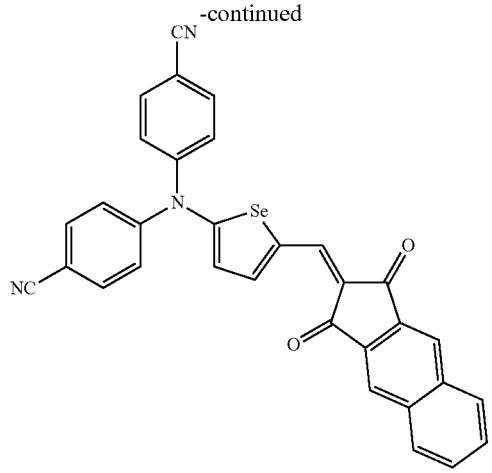
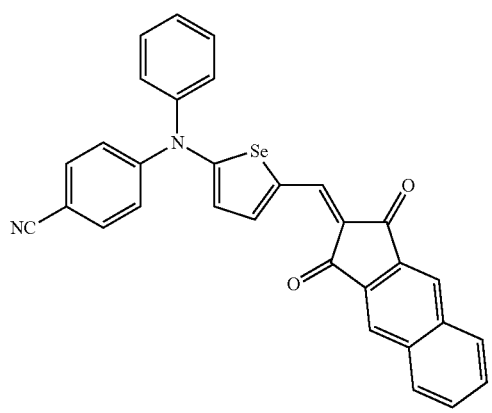
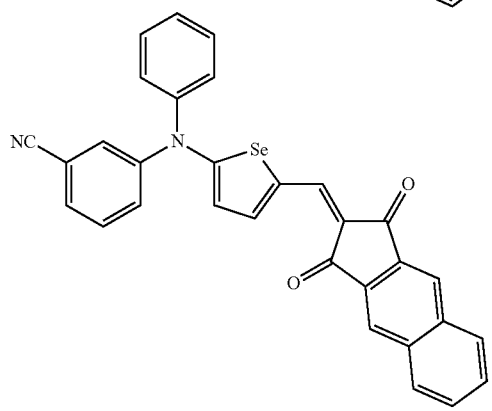
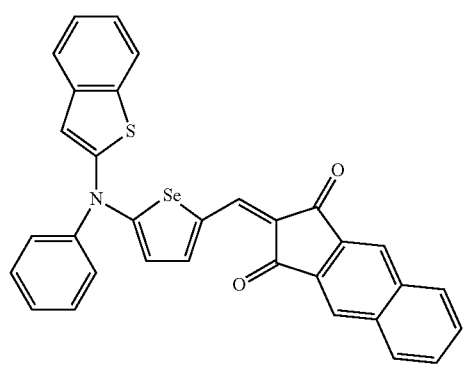
-continued
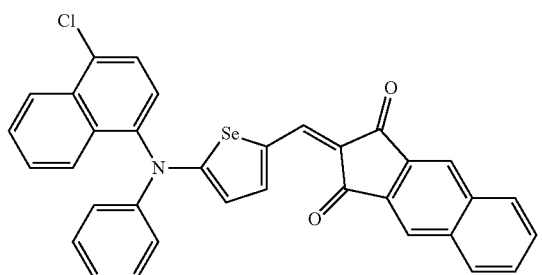
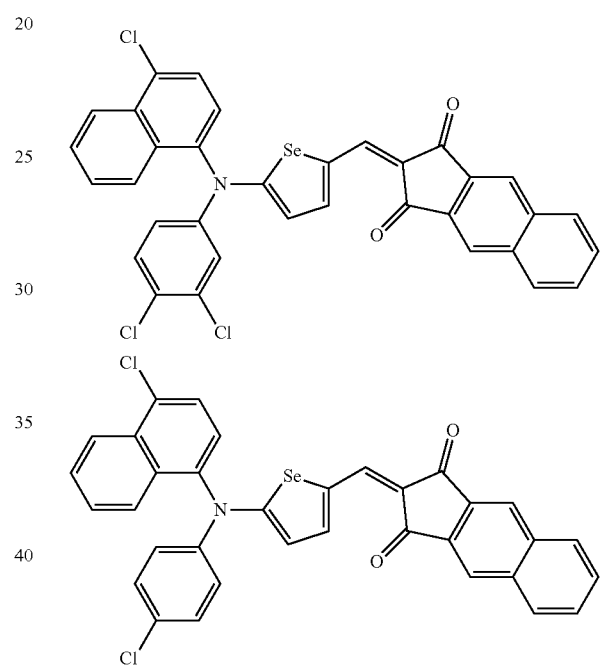
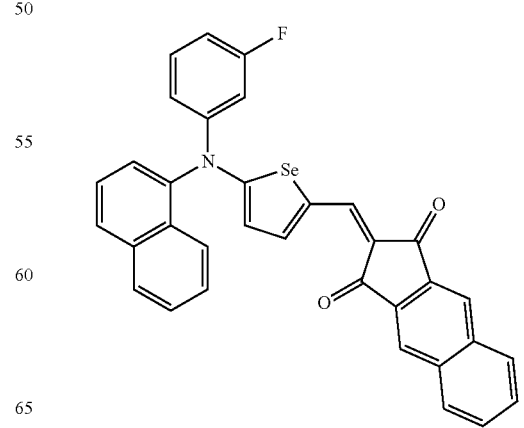

23 24
-continued -continued
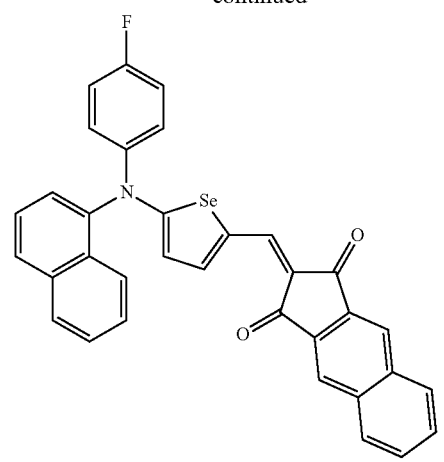
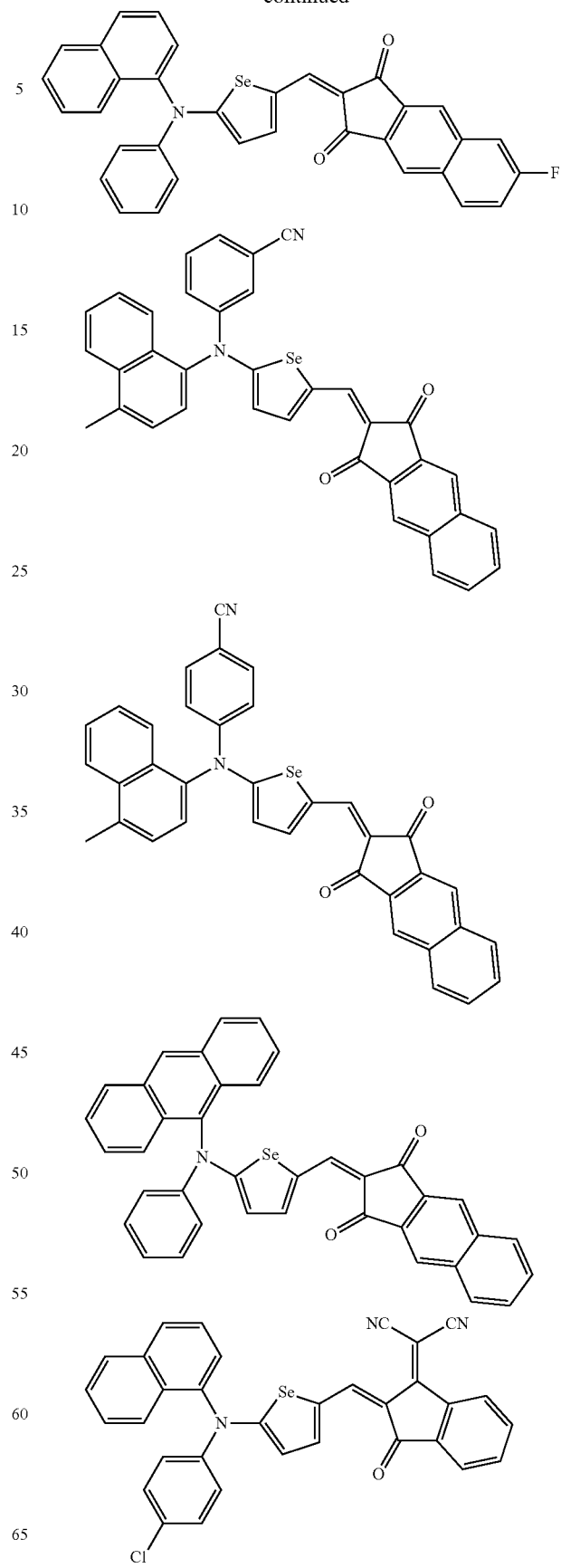

25
-continued
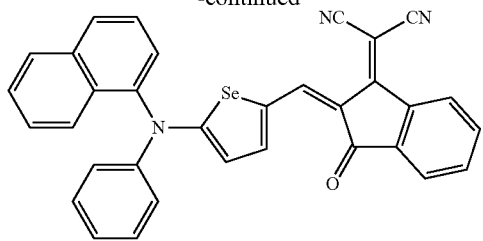
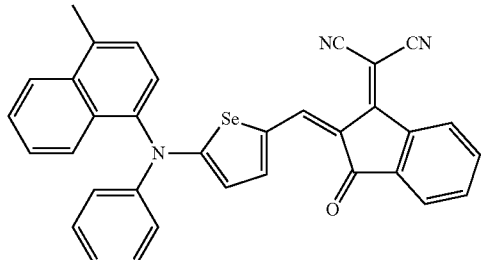
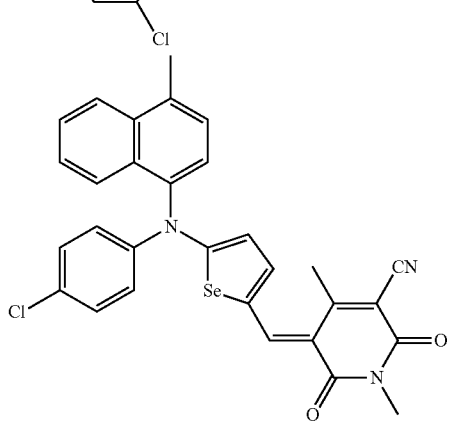
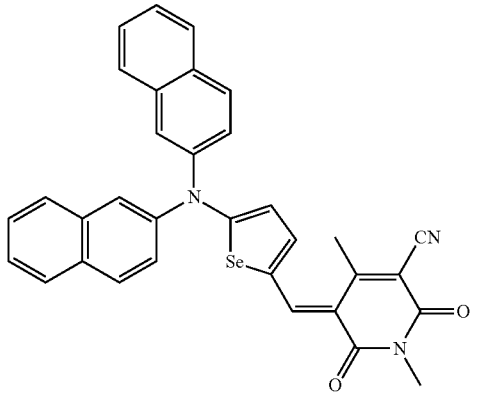
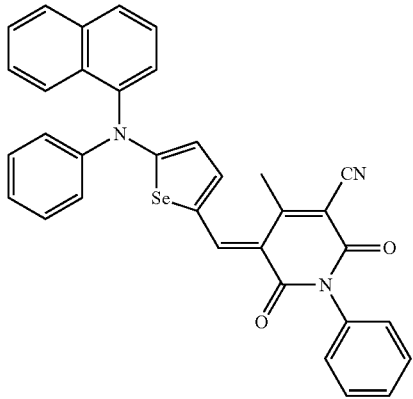
26
-continued
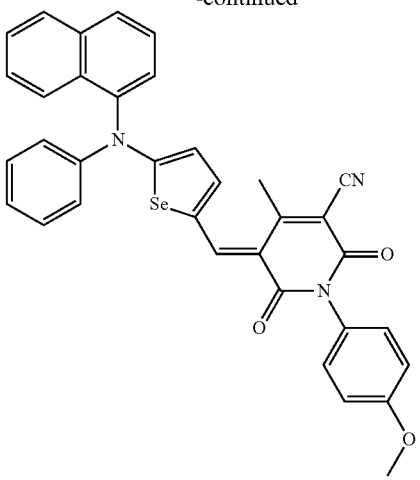
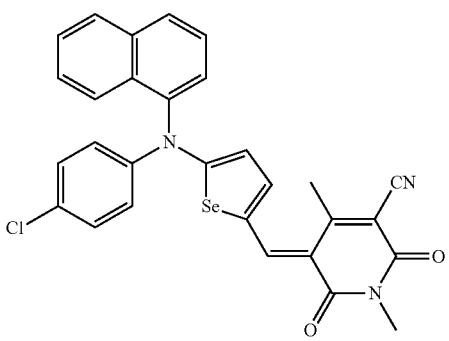
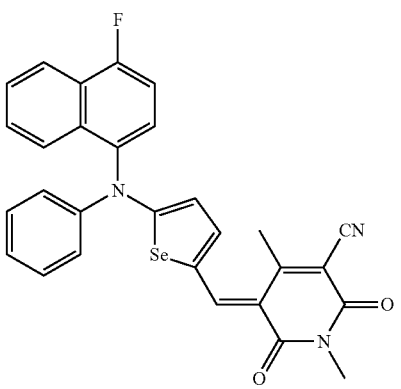
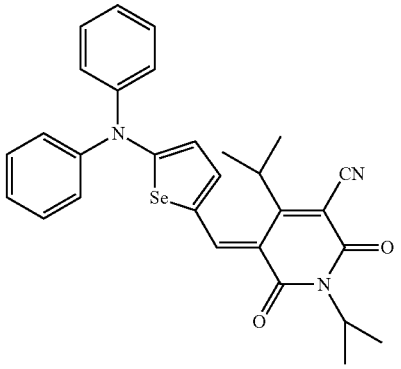

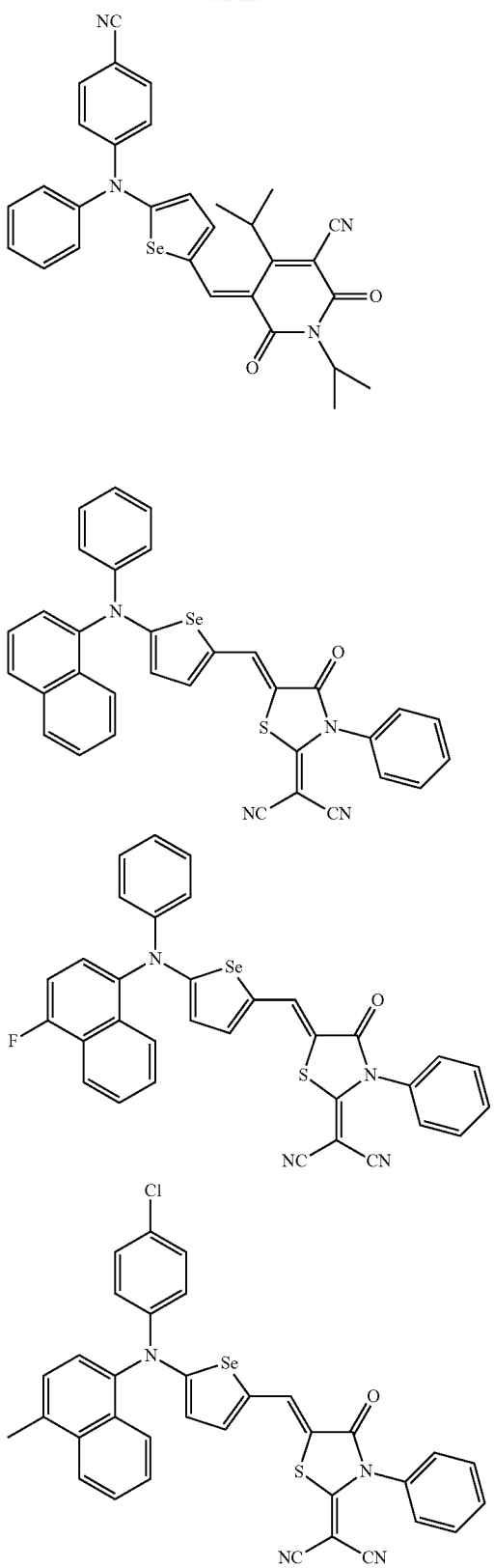

[Chemical Formula 1B-1]

[Chemical Formula 1B-2]

[Chemical Formula 1B-3]

[Chemical Formula 1B-4]

In Chemical Formulae 1B-1 to 1B-4,

X is Se, Te, SO, $SO_2$, or $SiR^aR^b$, $Z^1$ is O or $CR^cR^d$, $Y^1$ is N or $CR^e$, $Y^2$ is selected from O, S, Se, Te, and $C(R^f)(CN)$, $Y^3$ is O, S, Se, or Te, $Y^4$ is N or $NR^{18a}$, $Y^5$ is $CR^{19a}$ or $C=CR^{20a}(CN)$, $Ar^{1a}$ and $Ar^{2a}$ are independently a substituted or unsubstituted $C_6$ to $C_{30}$ aryl group or a substituted or unsubstituted $C_3$ to $C_{30}$ heteroaryl group, $G^1$ is selected from a single bond, $-(CR^gR^h)_{n2}-$, $-O-$, $-S-$, $-Se-$, $-N=$, $-NR^i-$, $-SiR^jR^k-$, and $-GeR^lR^m-$, wherein n2 is 1 or 2, $R^{1a}$ to $R^{3a}$, $R^{11a}$, $R^{12a}$, $R^{15a}$ to $R^{20a}$, $R^{24a}$, $R^{25a}$, and $R^a$ to $R^m$ are independently hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a substituted or unsubstituted $C_1$ to $C_6$ alkoxy group, a halogen, or a cyano group, n1 is 0 or 1, n2 is 0, 1 or 2, m1 is 0 or 1, and m2 is an integer of 0 to 4.

The compound represented by one of Chemical Formulae 1B-1 to 1B-4 may be, for example compounds of Group 2, but is not limited thereto.

The p-type light-absorbing material may be, for example a compound represented by one of Chemical Formulae 1B-1 to 1B-4.

[Group 2]
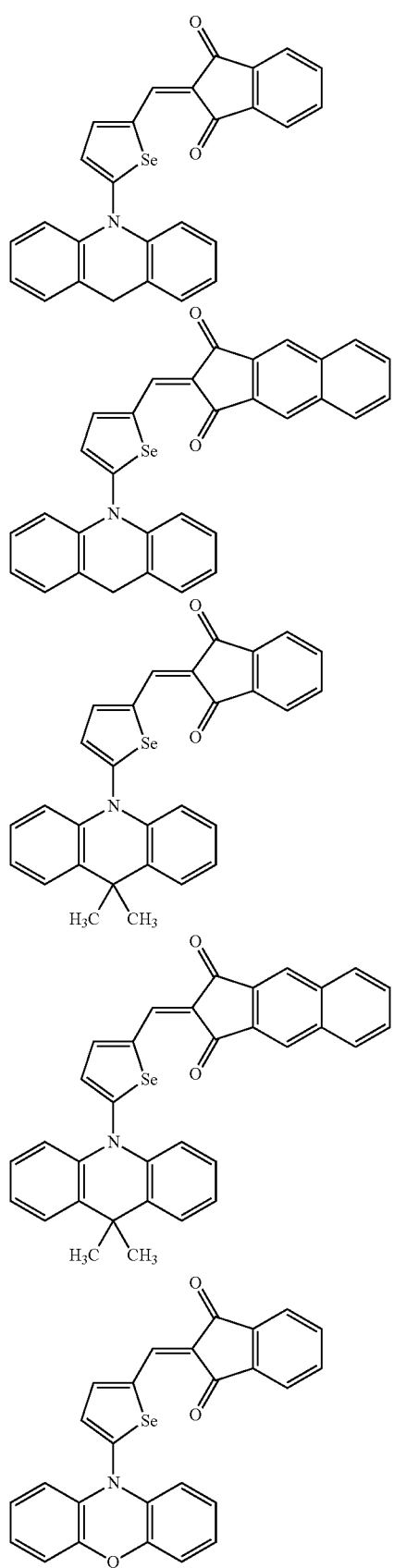
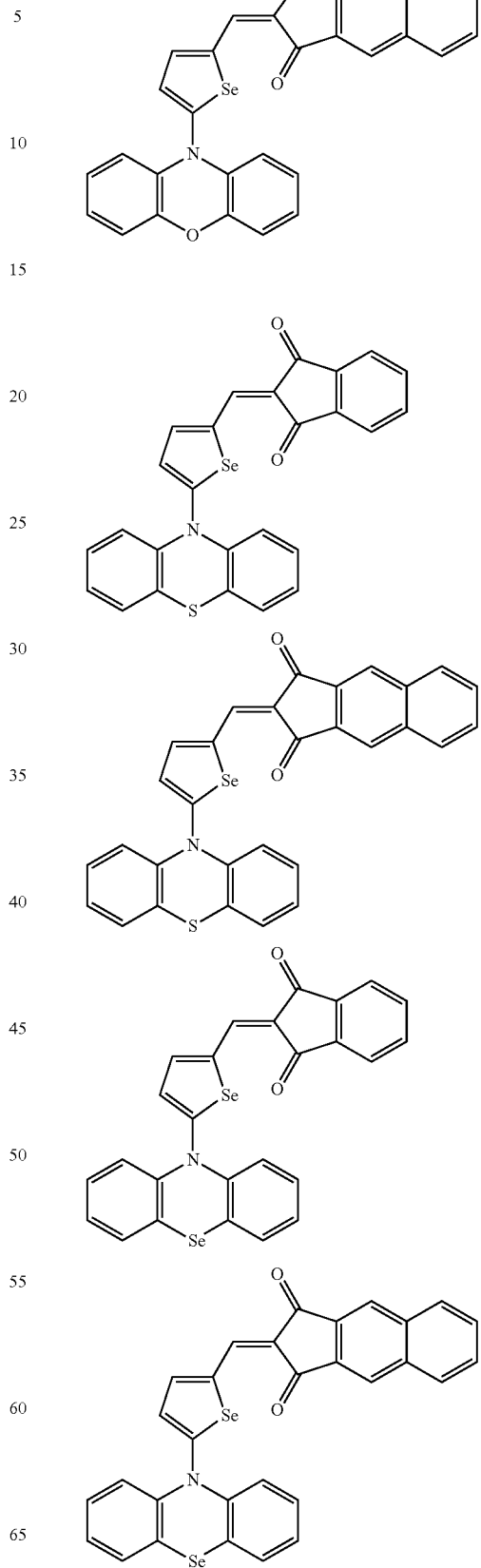

-continued
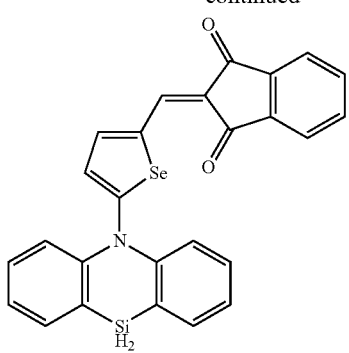
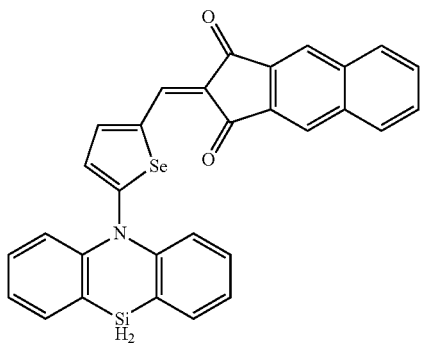
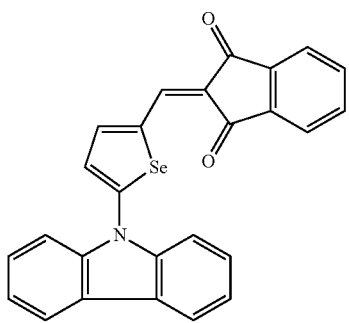
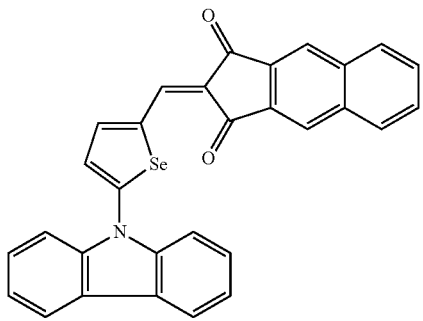
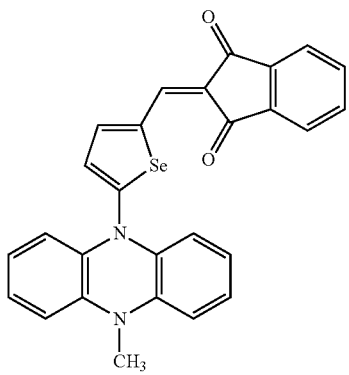
-continued
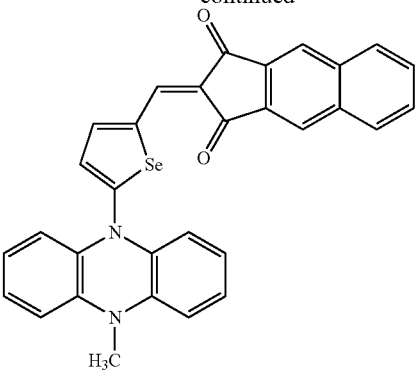
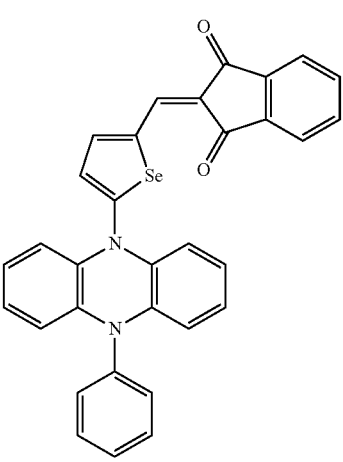
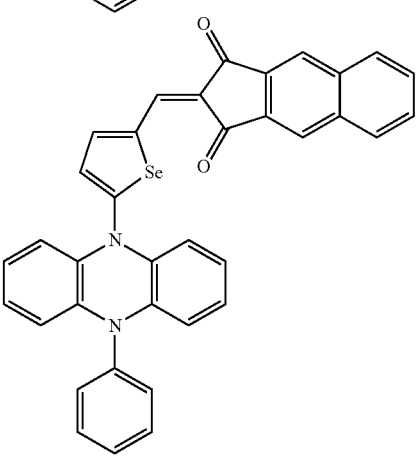
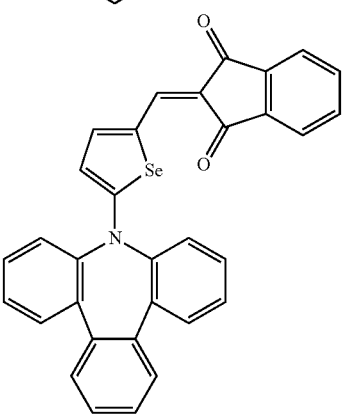

33
-continued
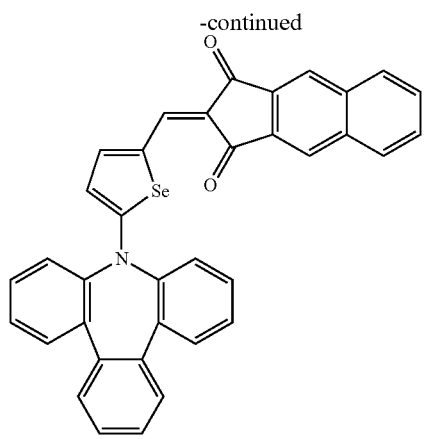
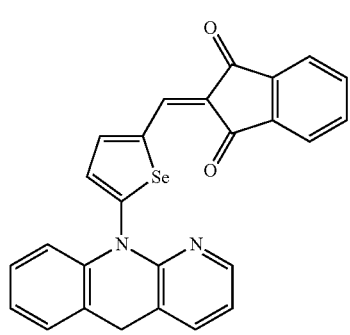
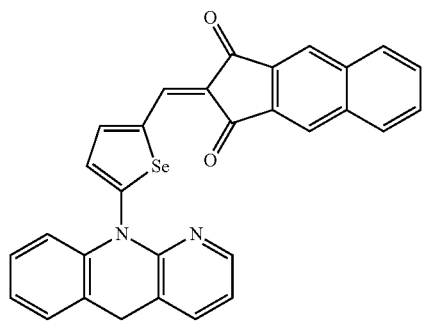
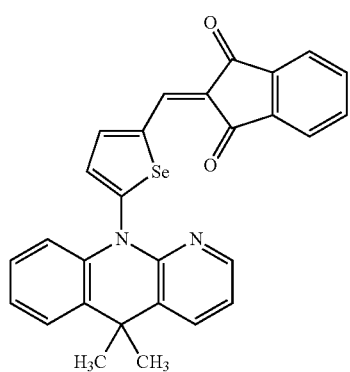
34
-continued
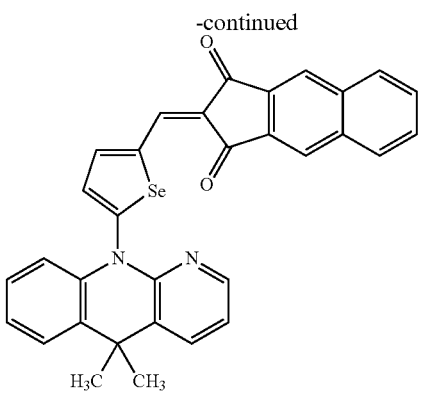
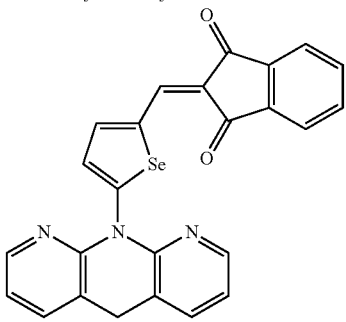
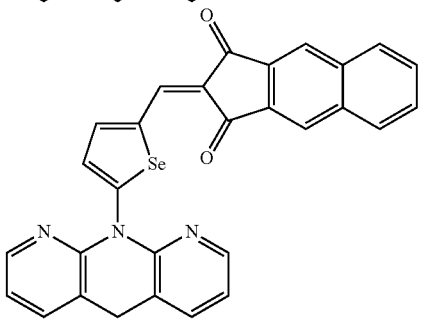
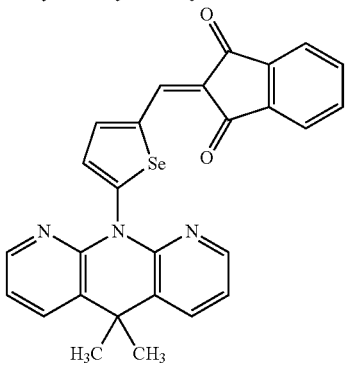
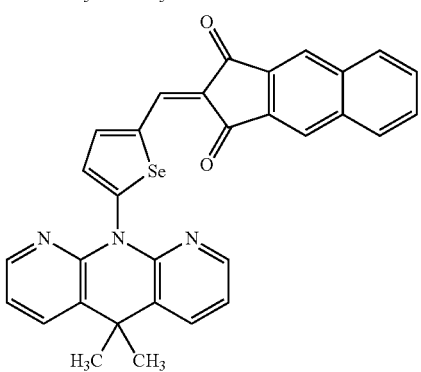

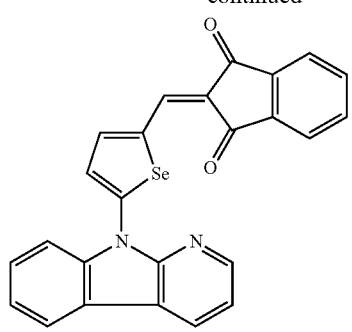
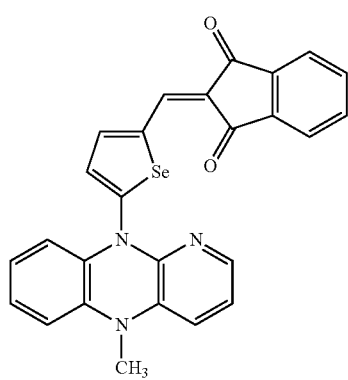
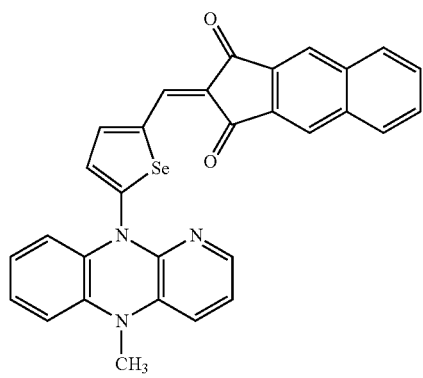
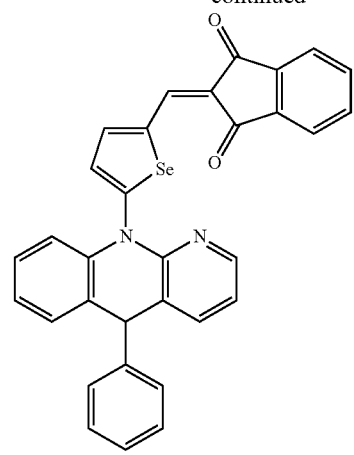
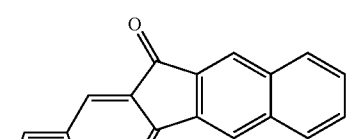
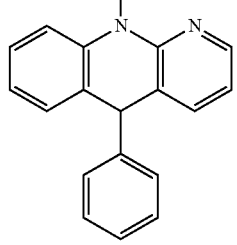
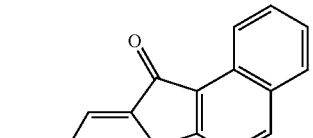
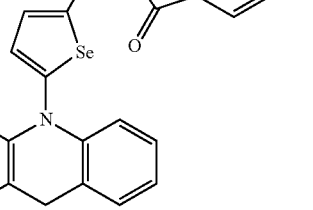
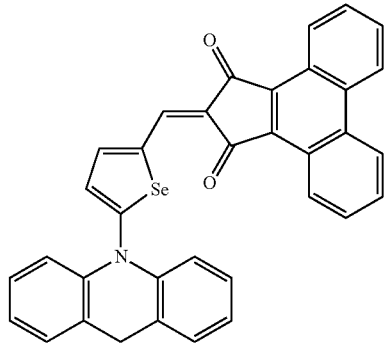
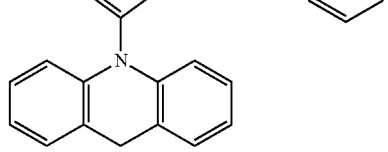

-continued
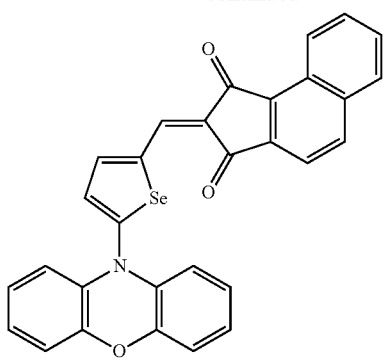
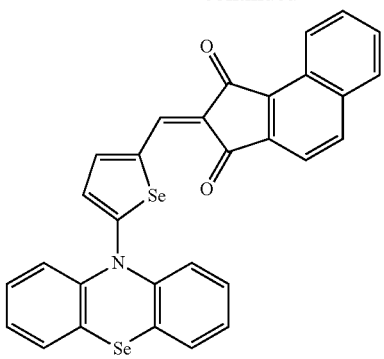
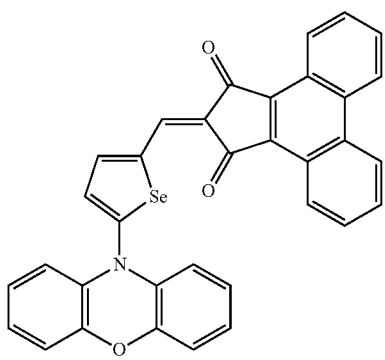
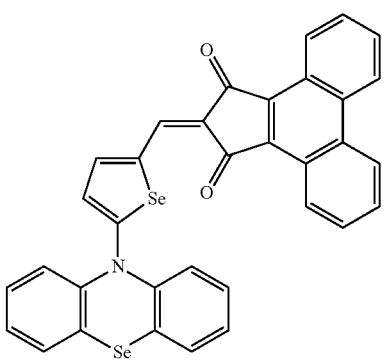
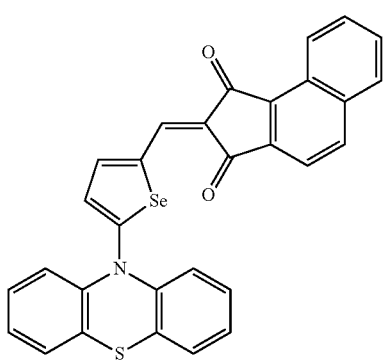
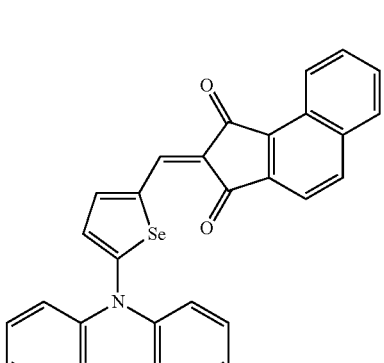
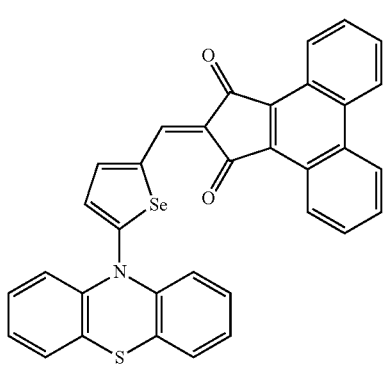
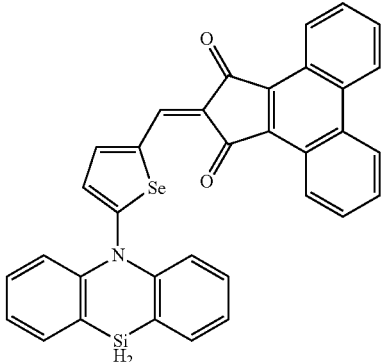

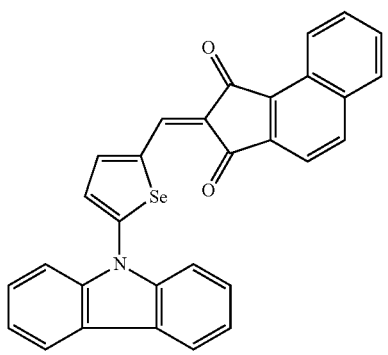
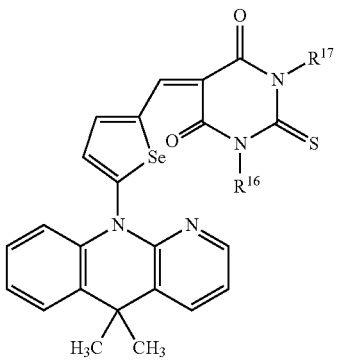
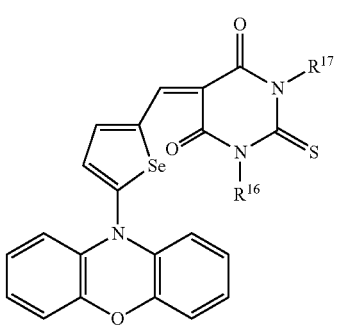
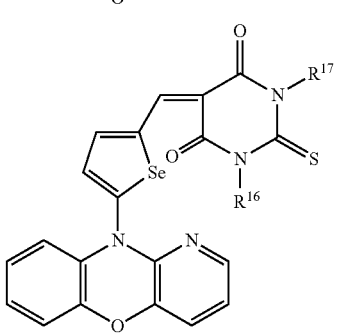
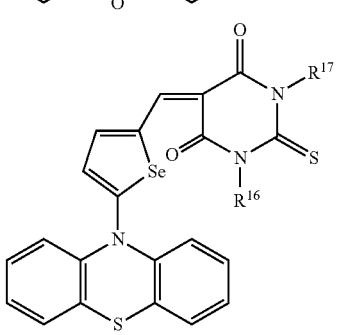
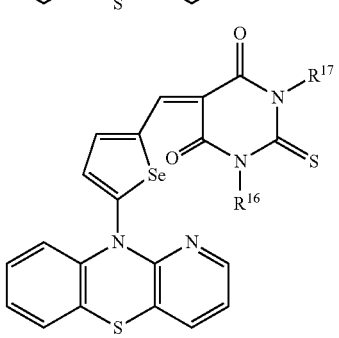

-continued
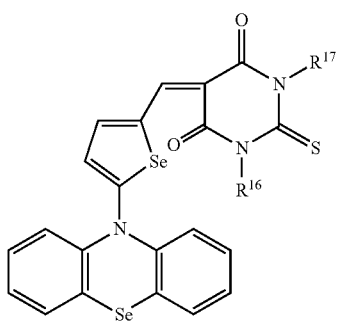
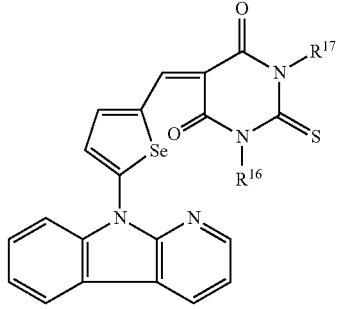
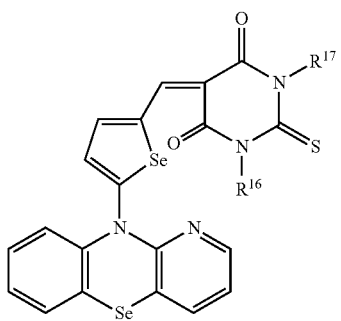
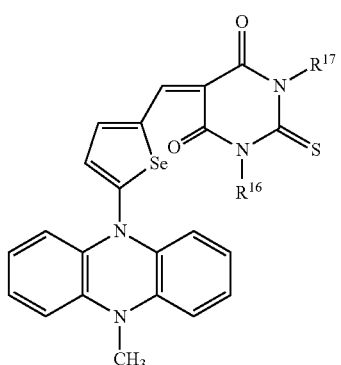
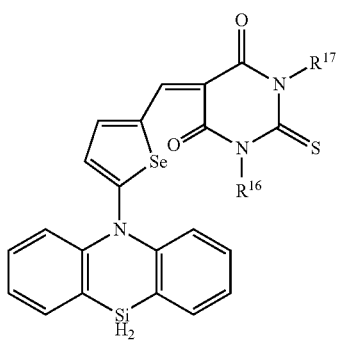
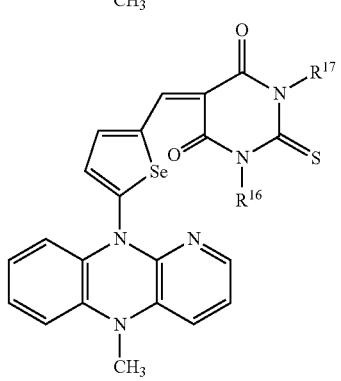
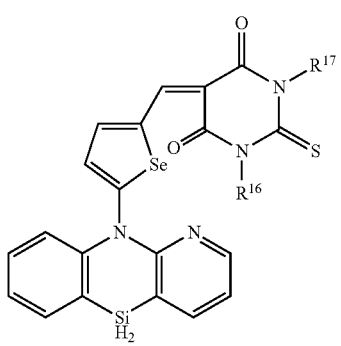
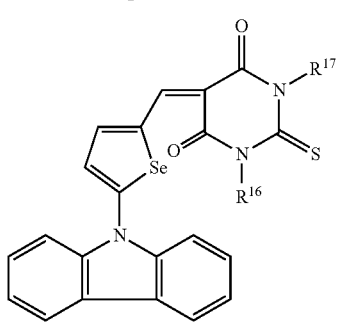
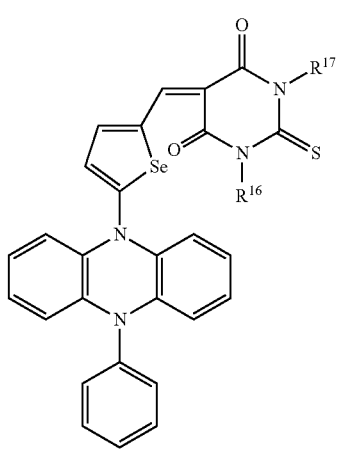

-continued
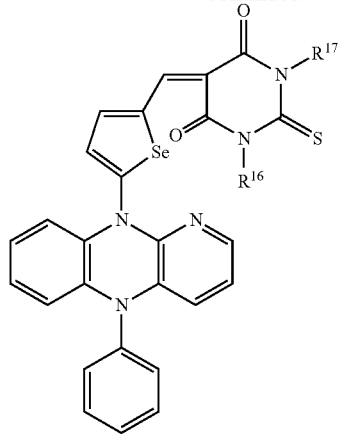
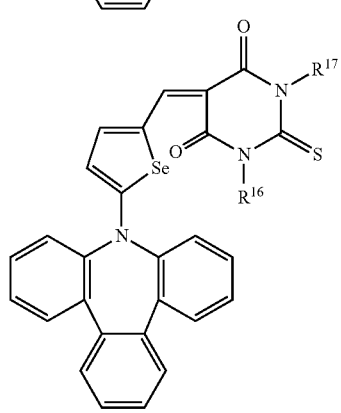
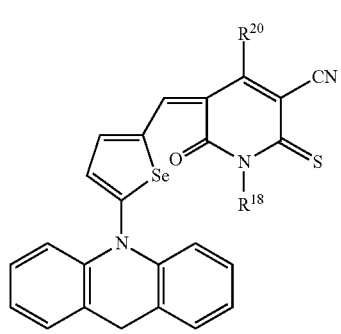
-continued
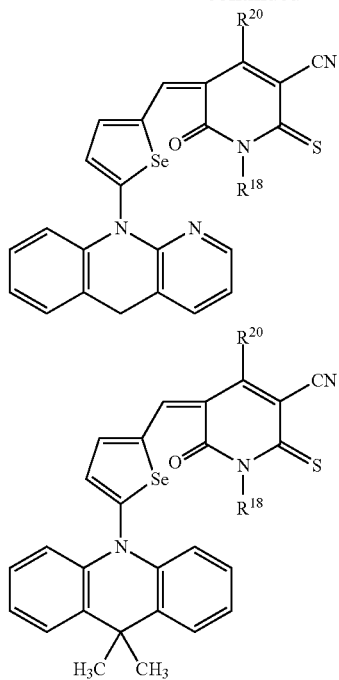
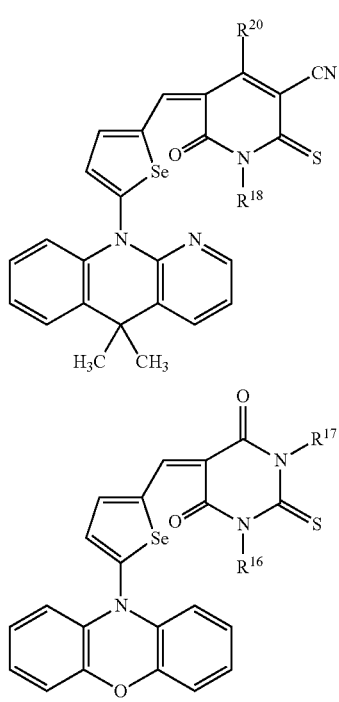
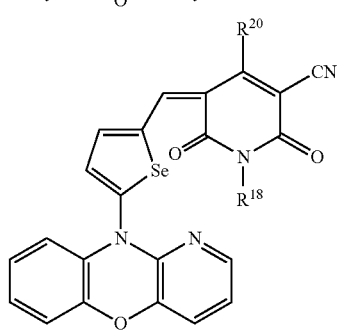

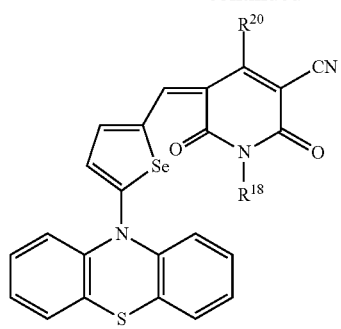
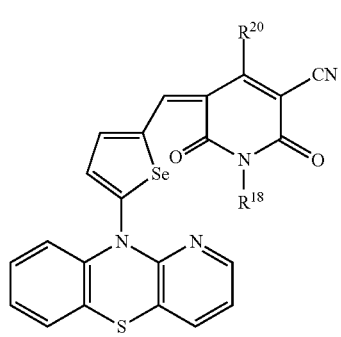
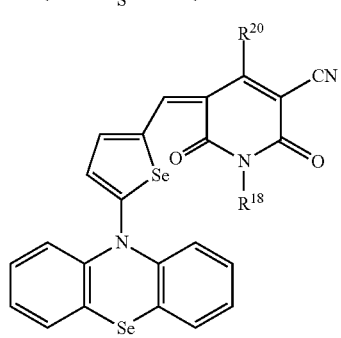
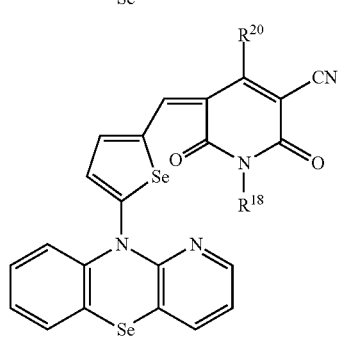
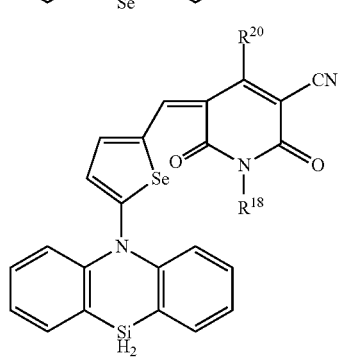
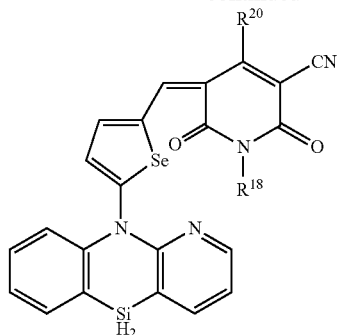
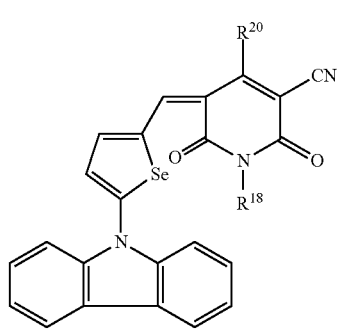
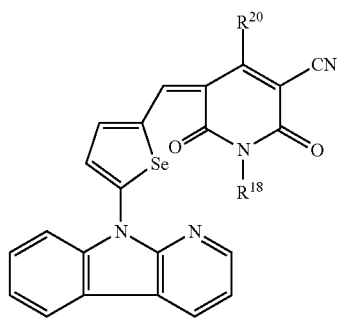
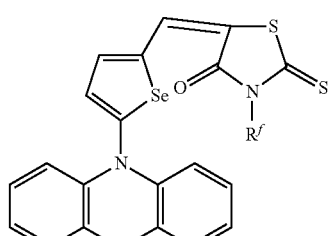
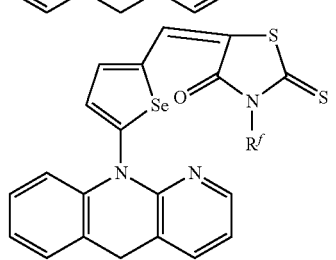

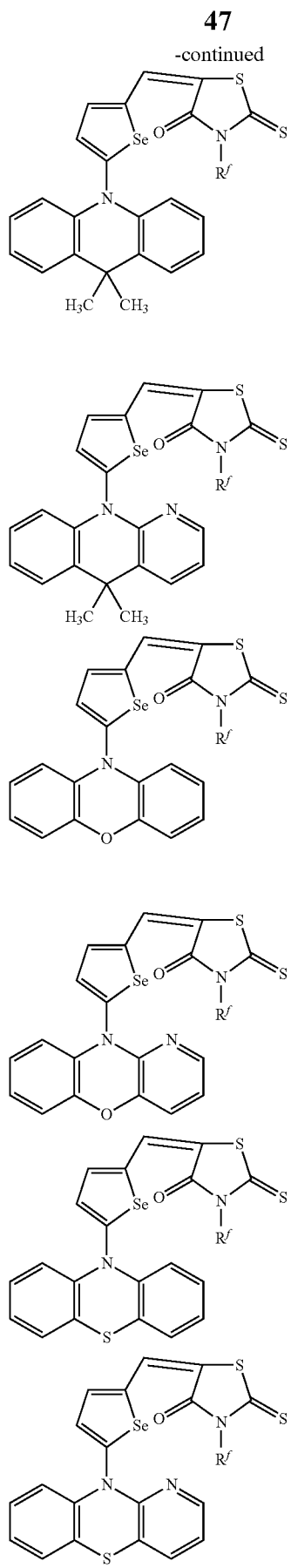
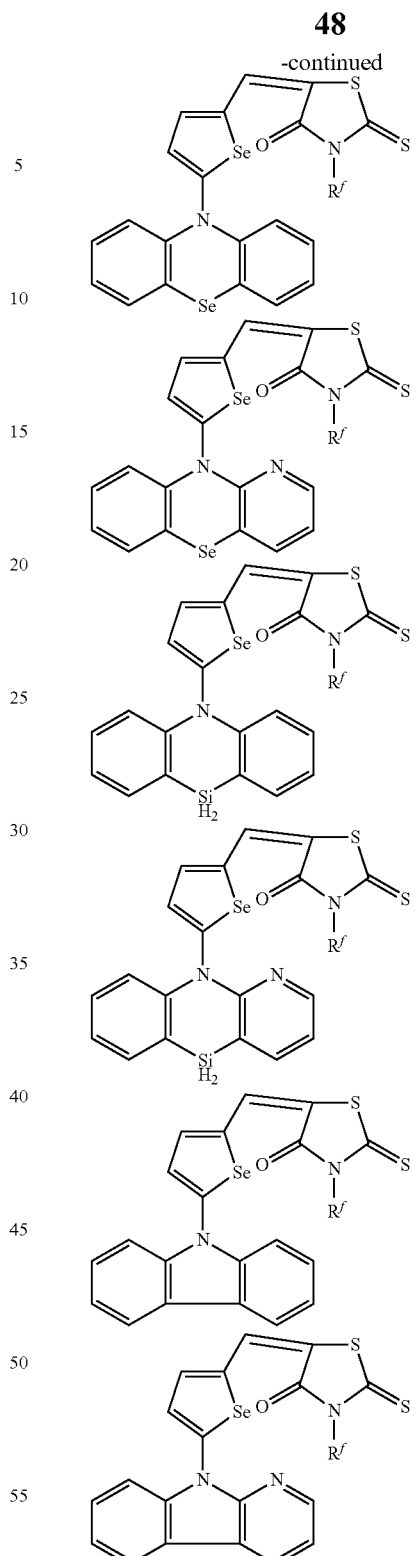

In Group 2,
hydrogen of each aromatic ring may be replaced by a substituent selected from a substituted or unsubstituted $C_1$ to $C_{30}$ alkyl group, a substituted or unsubstituted $C_1$ to $C_{30}$ alkoxy group, a substituted or unsubstituted $C_6$ to $C_{30}$ aryl group, a substituted or unsubstituted $C_4$ to $C_{30}$ heteroaryl group, a halogen, a cyano group, a cyano-containing group, and a combination thereof, and each of $R^{16}$, $R^{17}$, $R^{18}$, $R^{20}$, and $R^f$ are independently hydrogen, a substituted or unsubstituted $C_1$ to $C_{30}$ alkyl group, a substituted or unsubstituted $C_1$ to $C_{30}$ alkoxy group, a substituted or unsubstituted Ce to $C_{30}$ aryl group, a substituted or unsubstituted $C_4$ to $C_{30}$ heteroaryl group, halogen, a cyano group, a cyano-containing group, or a combination thereof.

The light-absorption layer 30 may be an intrinsic layer (I layer), and may further include a p-type layer and/or an n-type layer on one surface or both surfaces of the light-absorption layer 30. For example, the organic photoelectronic device 100 may include various combinations of a p-type layer/I layer, an I layer/n-type layer, a p-type layer/I layer/n-type layer, etc., between the first electrode 10 and the second electrode 20. The p-type layer may include a p-type light-absorbing material and the n-type layer may include an n-type light-absorbing material.

The light-absorption layer 30 may have a thickness of about 1 nm to about 500 nm, and specifically, about 5 nm to about 300 nm. When the light-absorption layer 30 has a thickness within the range, the light-absorption layer 30 may effectively absorb light, effectively separate holes from electrons, and deliver them, thereby effectively improving photoelectronic conversion efficiency.

The organic photoelectronic device 100 may further include an anti-reflection layer (not shown) on one surface of the first electrode 10 or the second electrode 20.

The anti-reflection layer is disposed at an incident side and may lower reflectance of incident light and further improve light absorption. For example, when light enters the first electrode 10, the anti-reflection layer may be disposed on one surface of the first electrode 10, and when light enters the second electrode 20, the anti-reflection layer may be disposed on one surface of the second electrode 20.

The anti-reflection layer may for example include a material having a refractive index of about 1.6 to about 2.5, for example, at least one of a metal oxide, a metal sulfide, and an organic material having a refractive index within the range. The anti-reflection layer may for example include a metal oxide such as an aluminum-containing oxide, a molybdenum-containing oxide, a tungsten-containing oxide, a vanadium-containing oxide, a rhenium-containing oxide, a niobium-containing oxide, a tantalum-containing oxide, a titanium-containing oxide, a nickel-containing oxide, a copper-containing oxide, a cobalt-containing oxide, a manganese-containing oxide, a chromium-containing oxide, a tellurium-containing oxide, or a combination thereof; a metal sulfide such as a zinc sulfide; or an organic material such as an amine derivative but is not limited thereto.

Figure 3:
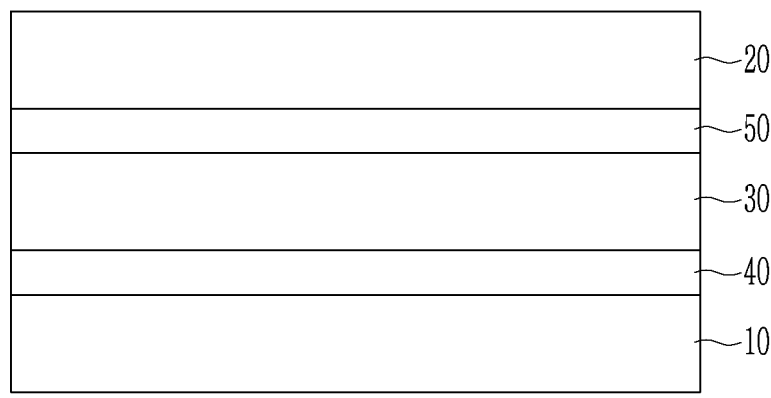
FIG. 3 is a cross-sectional view showing an organic photoelectronic device according to example embodiments.

FIG. 3 is a cross-sectional view showing an organic photoelectronic device according to example embodiments.

Referring to FIG. 3, an organic photoelectronic device 200 according to example embodiments includes a first electrode 10 and a second electrode 20 facing each other, and the light-absorption layer 30 between the first electrode 10 and the second electrode 20, like the above example embodiment illustrated in FIG. 2. The first electrode 10, the second electrode 20, and the light-absorption layer 30 are the same as described above.

However, the organic photoelectronic device 200 according to example embodiments further includes charge auxiliary layers 40 and 50 between the first electrode 10 and the light-absorption layer 30 and the second electrode 20 and the light-absorption layer 30, unlike the above example embodiment illustrated in FIG. 2. The charge auxiliary layers 40 and 50 may facilitate the transfer of holes and electrons separated from the light-absorption layer 30, so as to increase efficiency.

The charge auxiliary layers 40 and 50 may be at least one selected from a hole injection layer (HIL) for facilitating hole injection, a hole transport layer (HTL) for facilitating hole transport, an electron blocking layer (EBL) for reducing or preventing electron transport, an electron injection layer (EIL) for facilitating electron injection, an electron transport layer (ETL) for facilitating electron transport, and a hole blocking layer (HBL) for reducing or preventing hole transport.

The charge auxiliary layers 40 and 50 may include, for example, an organic material, an inorganic material, or an organic/inorganic material. The organic material may be an organic compound having hole or electron characteristics, and the inorganic material may be, for example, a metal oxide such as a molybdenum oxide, a tungsten oxide, a nickel oxide, etc.

The hole transport layer (HTL) may include one selected from, for example, poly(3,4-ethylenedioxythiophene):poly(styrenesulfonate) (PEDOT:PSS), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4''-tris(N-carbazolyl)-triphenylamine (TCTA), and a combination thereof, but is not limited thereto.

The electron blocking layer (EBL) may include one selected from, for example, poly(3,4-ethylenedioxythiophene):poly(styrenesulfonate) (PEDOT:PSS), polyarylamine, poly(N-vinylcarbazole), polyaniline, polypyrrole, N,N,N',N'-tetrakis(4-methoxyphenyl)-benzidine (TPD), 4-bis[N-(1-naphthyl)-N-phenyl-amino]biphenyl (α-NPD), m-MTDATA, 4,4',4''-tris(N-carbazolyl)-triphenylamine (TCTA), and a combination thereof, but is not limited thereto.

The electron transport layer (ETL) may include one selected from, for example, 1,4,5,8-naphthalene-tetracarboxylic dianhydride (NTCDA), bathocuproine (BCP), LiF, $Alq_3$, $Gaq_3$, $Inq_3$, $Znq_2$, $Zn(BTZ)_2$, $BeBq_2$, and a combination thereof, but is not limited thereto.

The hole blocking layer (HBL) may include one selected from, for example, 1,4,5,8-naphthalene-tetracarboxylic dianhydride (NTCDA), bathocuproine (BCP), LiF, $Alq_3$, $Gaq_3$, $Inq_3$, $Znq_2$, $Zn(BTZ)_2$, $BeBq_2$, and a combination thereof, but is not limited thereto.

Either one of the charge auxiliary layers 40 and 50 may be omitted.

The organic photoelectronic device may be applied to an image sensor, a photo-detector, a photo-sensor, etc., but is not limited thereto.

The organic photoelectronic device may be for example applied to an image sensor.

Hereinafter, an example of an image sensor including the organic photoelectronic device is described referring to drawings. As an example of an image sensor, an organic CMOS image sensor is illustrated.

Figure 4:
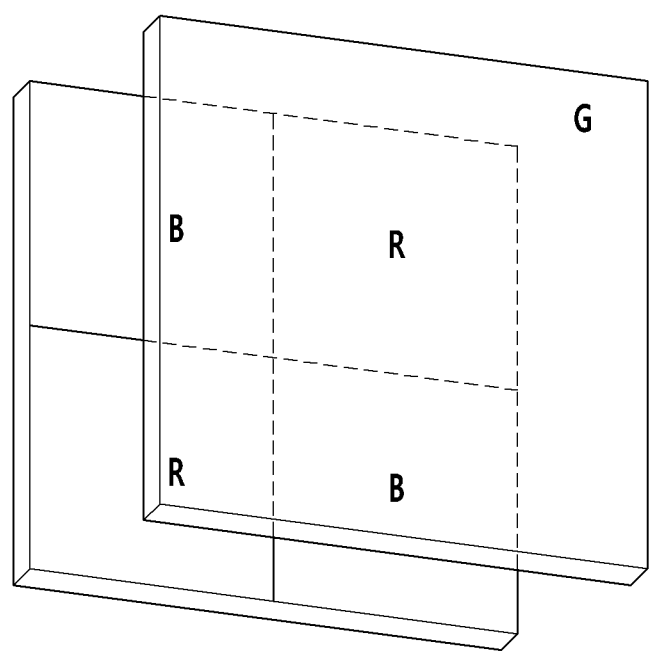
FIG. 4 is a schematic top plan view showing an organic CMOS image sensor according to example embodiments.
Figure 5A:
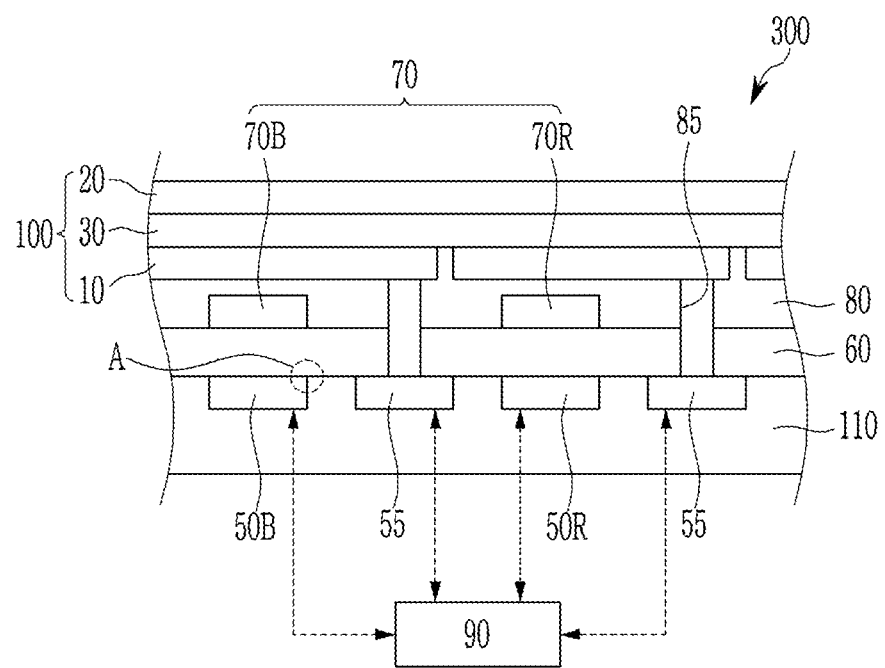
FIG. 5A is a cross-sectional view showing one example of the CMOS image sensor of FIG. 4.

FIG. 4 is a schematic top plan view showing an organic CMOS image sensor according to example embodiments. FIG. 5A is a cross-sectional view showing one example of the organic CMOS image sensor of FIG. 4 and FIG. 5B is a cross-sectional view of a portion A of the image sensor 300 illustrated in FIG. 5A.

Figure 5B:
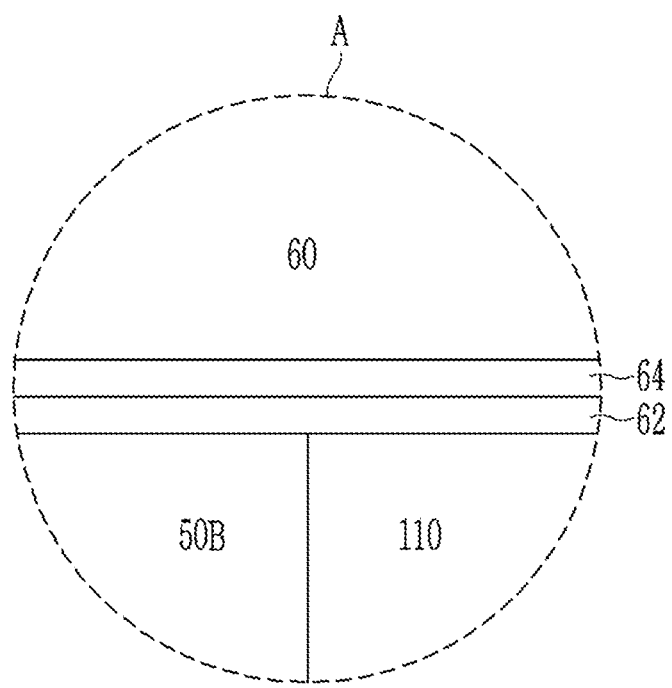
FIG. 5B is a cross-section view of a portion A of the image sensor 300 illustrated in FIG. 5A.

Referring to FIGS. 4, 5A and 5B, an organic CMOS image sensor 300 according to example embodiments includes a semiconductor substrate 110 integrated with photo-sensing devices 50B and 50R, a transmission transistor 90, and a charge storage 55, a lower insulation layer 60, a color filter layer 70, an upper insulation layer 80, and an organic photoelectronic device 100.

The semiconductor substrate 110 may be a silicon substrate, and is integrated with the photo-sensing devices 50B and 50R, the transmission transistor (not shown), and the charge storage 55. The photo-sensing devices 50R and 50B may be photodiodes.

The photo-sensing devices 50B and 50R, the transmission transistor 90, and/or the charge storage 55 may be integrated in each pixel, and as shown in the drawing, the photo-sensing devices 50B and 50R may be included in a blue pixel and a red pixel and the charge storage 55 may be included in a green pixel.

The photo-sensing devices 50B and 50R sense light, the information sensed by the photo-sensing devices may be transferred by the transmission transistor 90, and the charge storage 55 is electrically connected with the organic photoelectronic device 100, so the information of the charge storage 55 may be transferred by the transmission transistor 90.

In some example embodiments, including the example embodiments shown in FIG. 5B, a metal wire 62 and a pad 64 are formed on the semiconductor substrate 110. In order to decrease signal delay, the metal wire 62 and pad 64 may at least partially comprise a metal having relatively low resistivity, for example, aluminum (Al), copper (Cu), silver (Ag), and alloys thereof, but is not limited thereto. In some example embodiments, the metal wire 62 and pad 64 may be positioned under the photo-sensing devices 50B and 50R.

Referring back to FIG. 5A, the lower insulation layer 60 is formed on the metal wire 62 and the pad 64. The lower insulation layer 60 may at least partially comprise an inorganic insulating material including a silicon oxide and/or a silicon nitride, or a low dielectric constant (low K) material including SiC, SiCOH, SiCO, and SiOF. The lower insulation layer 60 has a through-hole 85 exposing the charge storage 55. The through-hole 85 may be filled with fillers.

A color filter layer 70 is formed on the lower insulation layer 60. The color filter layer 70 includes a blue filter 70B formed in the blue pixel and a red filter 70R formed in the red pixel. In example embodiments, a green filter is not formed but may be formed if needed.

The upper insulation layer 80 is formed on the color filter layer 70. The upper insulation layer 80 eliminates a step caused by the color filter layer 70 and smoothes the surface. The upper insulation layer 80 and lower insulation layer 60 may include a contact hole (not shown) exposing a pad, and the through-hole 85 exposing the charge storage 55 of a green pixel.

The organic photoelectronic device 100 is formed on the upper insulation layer 80. The organic photoelectronic device 100 includes the first electrode 10, the light-absorption layer 30, and the second electrode 20 as described above.

The first electrode 10 and the second electrode 20 may be transparent electrodes, and the light-absorption layer 30 is the same as described above. The light-absorption layer 30 may selectively absorb light in a green wavelength region and replaces a color filter of a green pixel.

When light enters from the second electrode 20, the light in a green wavelength region may be mainly absorbed in the light-absorption layer 30 and photoelectrically converted, while the light in the rest of the wavelength regions passes through the first electrode 10 and may be sensed in photo-sensing devices 50B and 50R.

As described above, the organic photoelectronic device configured to selectively absorb light in a green wavelength region has a stack structure, and thus the size of an image sensor may be reduced to realize a down-sized image sensor. In addition, as described above, a crosstalk due to light in other wavelength regions except green may be reduced and sensitivity of an image sensor may be increased by improving green wavelength selectivity in the light-absorption layer 30 of the organic photoelectronic device 100.

In FIG. 5A, the organic photoelectronic device 100 of FIG. 1 is included, but it is not limited thereto, and thus the organic photoelectronic device 200 of FIG. 3 may be applied in the same manner.

In FIGS. 4 and 5A, a stack structure where an organic photoelectronic device configured to selectively absorb light in a green wavelength region is stacked is illustrated as an example, but the present disclosure is not limited thereto. The present disclosure may have a structure where an organic photoelectronic device configured to selectively absorb light in a blue wavelength region is stacked and a green photo-sensing device and a red photo-sensing device may be integrated in the semiconductor substrate 110, or a structure where an organic photoelectronic device configured to selectively absorb light in a red wavelength region is stacked and a green photo-sensing device and a blue photo-sensing device may be integrated in the semiconductor substrate 110.

Figure 6:
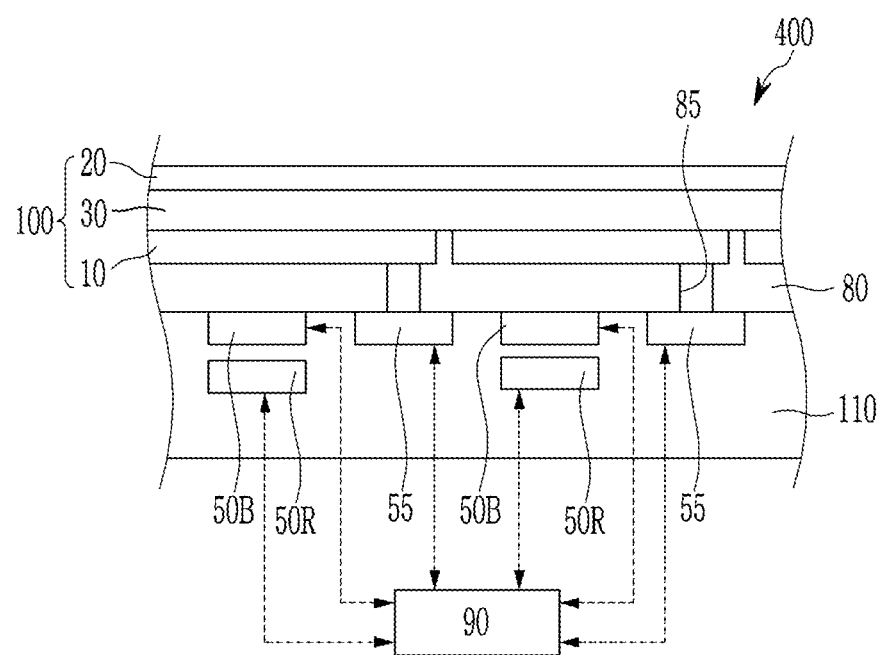
FIG. 6 is a cross-sectional view showing another example of an organic CMOS image sensor of FIG. 4.

FIG. 6 is a cross-sectional view showing another example of the organic CMOS image sensor of FIG. 4.

The organic CMOS image sensor 400 according to example embodiments includes a semiconductor substrate 110 integrated with photo-sensing devices 50B and 50R, a transmission transistor (not shown), and a charge storage 55, an upper insulation layer 80, and an organic photoelectronic device 100, like the above example embodiment illustrated in FIG. 5A.

The organic CMOS image sensor 400 according to example embodiments includes the blue photo-sensing device 50B and the red photo-sensing device 50R stacked in a vertical direction and a color filter layer 70 is omitted. The blue photo-sensing device 50B and the red photo-sensing device 50R are electrically connected with the charge storage 55 and may be transferred by the transmission transistor 90.

The blue photo-sensing device 50B and the red photo-sensing device 50R may selectively absorb light in each wavelength region according to a stack depth.

As described above, the organic photoelectronic device configured to selectively absorb light in a green wavelength region has a stack structure and the red photo-sensing device and the blue photo-sensing device are stacked and thus the size of an image sensor may be reduced to realize a down-sized image sensor. In addition, as described above, a crosstalk due to light in other wavelength regions except green may be reduced and sensitivity may be increased by improving green wavelength selectivity in the light-absorption layer 30 of the organic photoelectronic device 100.

In FIG. 6, the organic photoelectronic device 100 of FIG. 1 is included, but it is not limited thereto, and thus the organic photoelectronic device 200 of FIG. 3 may be applied in the same manner.

In FIG. 6, a stack structure where an organic photoelectronic device configured to selectively absorb light in a green wavelength region is stacked is exemplarily illustrated, but the present disclosure is not limited thereto. The present disclosure may have a structure where an organic photoelectronic device configured to selectively absorb light in a blue wavelength region is stacked and a green photo-sensing device and a red photo-sensing device may be integrated in the semiconductor substrate 110, or a structure where an organic photoelectronic device configured to selectively absorb light in a red wavelength region is stacked and a green photo-sensing device and a blue photo-sensing device may be integrated in the semiconductor substrate 110.

Figure 7:
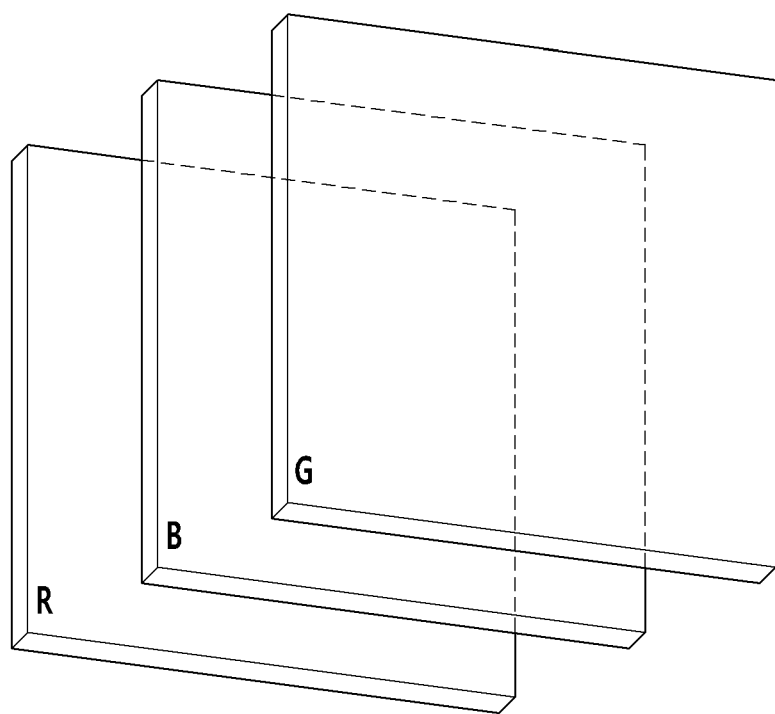
FIG. 7 is a schematic top plan view showing an organic CMOS image sensor according to example embodiments.
Figure 8A:
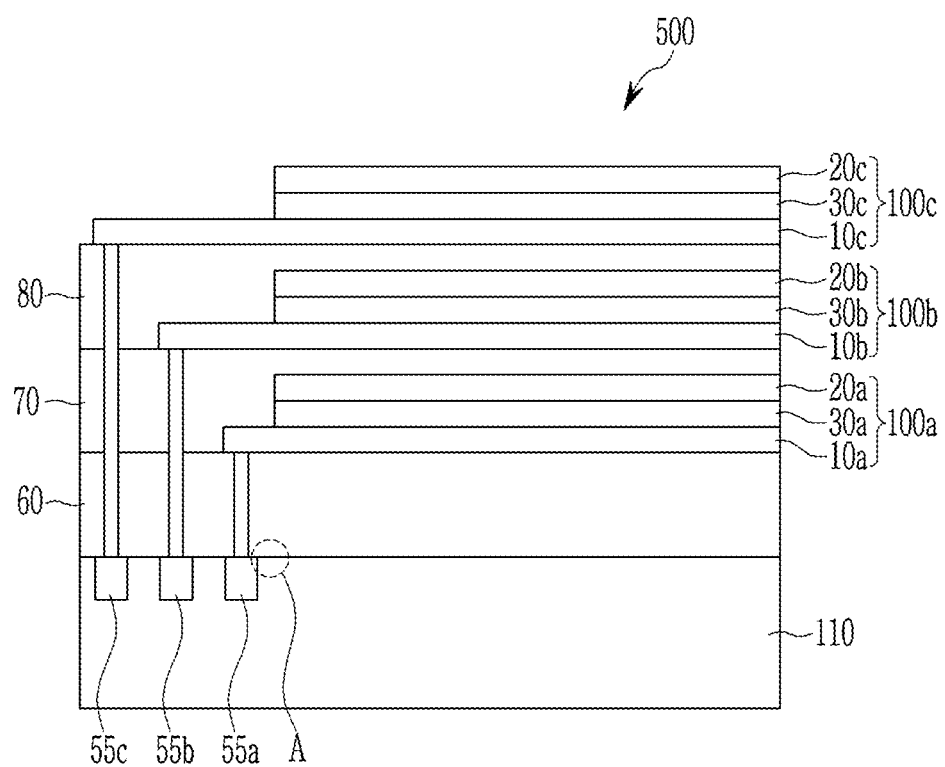
FIG. 8A is a cross-sectional view of an organic CMOS image sensor of FIG. 7
Figure 8B:
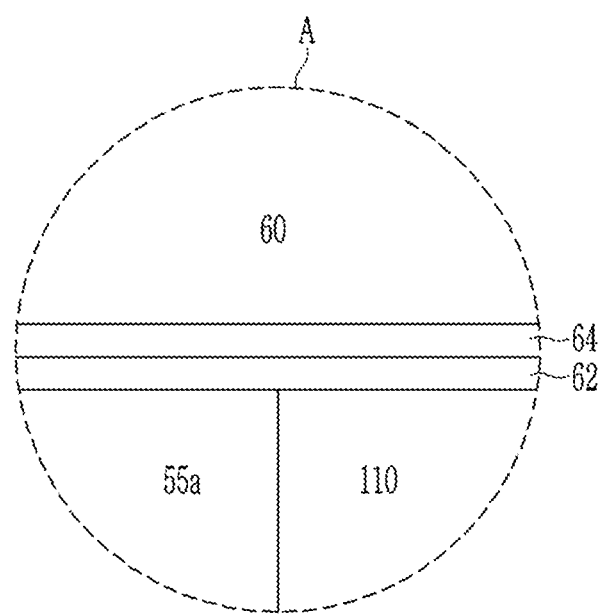
FIG. 8B is a cross-sectional view of a portion A of the image sensor 500 illustrated in FIG. 8A.

FIG. 7 is a schematic top plan view showing an organic CMOS image sensor according to example embodiments, and FIG. 8A is a cross-sectional view of an organic CMOS image sensor of FIG. 7 and FIG. 8B is a cross-sectional view of a portion A of the image sensor 500 illustrated in FIG. 8A.

The organic CMOS image sensor 500 according to example embodiments includes a green photoelectronic device configured to selectively absorb light in a green wavelength region, a blue photoelectronic device configured to selectively absorb light in a blue wavelength region, and a red photoelectronic device configured to selectively absorb light in a green wavelength region, and they are stacked.

The organic CMOS image sensor 500 according to example embodiments includes a semiconductor substrate 110, a lower insulation layer 60, an intermediate insulation layer 70, an upper insulation layer 80, a first organic photoelectronic device 100a, a second organic photoelectronic device 100b, and a third organic photoelectronic device 100c.

The semiconductor substrate 110 may be a silicon substrate, and is integrated with the transmission transistor 90 and the charge storages 55a, 55b, and 55c.

In some example embodiments, including the example embodiments shown in FIG. 9B, a metal wire 62 and a pad 64 are formed on the semiconductor substrate 110, and the lower insulation layer 60 is formed on the metal wire 62 and the pad 64.

The first organic photoelectronic device 100a is formed on the lower insulation layer 60.

The first organic photoelectronic device 100a includes a first electrode 10a and a second electrode 20a facing each other and a light-absorption layer 30a between the first electrode 10a and the second electrode 20a. One of the first electrode 10a and the second electrode 20a may be an anode and the other may be a cathode. The light-absorption layer 30a may selectively absorb light in one of red, blue, and green wavelength regions. For example, the first organic photoelectronic device 100a may be a red photoelectronic device.

The second organic photoelectronic device 100b is formed on the intermediate insulation layer 70.

The second organic photoelectronic device 100b is formed on the intermediate insulation layer 70.

The second organic photoelectronic device 100b includes a first electrode 10b and a second electrode 20b facing each other and a light-absorption layer 30b between the first electrode 10b and the second electrode 20b. One of the first electrode 10b and the second electrode 20b may be an anode and the other may be a cathode. The light-absorption layer 30b may selectively absorb light in one of red, blue, and green wavelength regions. For example, the second organic photoelectronic device 100b may be a blue photoelectronic device.

The upper insulation layer 80 is formed on the second organic photoelectronic device 100b. The lower insulation layer 60, the intermediate insulation layer 70, and the upper insulation layer 80 have a plurality of through-holes exposing the charge storages 55a, 55b, and 55c.

The third organic photoelectronic device 100c is formed on the upper insulation layer 80. The third organic photoelectronic device 100c includes a first electrode 10c and a second electrode 20c and the light-absorption layer 30c between the first electrode 10c and the second electrode 20c. One of the first electrode 10c and the second electrode 20c may be an anode and the other may be a cathode. The light-absorption layer 30c may selectively absorb light in one of red, blue, and green wavelength regions. For example, the third organic photoelectronic device 100c may be a green photoelectronic device.

At least one of the light-absorption layer 30a of the first organic photoelectronic device 100a, the light-absorption layer 30b of the second organic photoelectronic device 100b, and the light-absorption layer 30c of the third organic photoelectronic device 100c a photoelectric conversion region and a doped region including an exciton quencher, as described above. Specific illustration is the same as described above.

The drawing shows a structure in which the first organic photoelectronic device 100a, the second organic photoelectronic device 100b, and the third organic photoelectronic device 100c are sequentially stacked, but the present disclosure is not limited thereto, and they may be stacked in various orders.

As described above, the first organic photoelectronic device 100a, the second organic photoelectronic device 100b, and the third organic photoelectronic device 100c have a stack structure, and thus the size of an image sensor may be reduced to realize a down-sized image sensor. In addition, as described above, a crosstalk due to light in other wavelength regions except green may be reduced and sensitivity may be increased by improving green wavelength selectivity in the light-absorption layer 30 of the organic photoelectronic device 100.

The image sensor may be applied to, for example, various electronic devices such as a mobile phone or a digital camera, but is not limited thereto.

Figure 9:
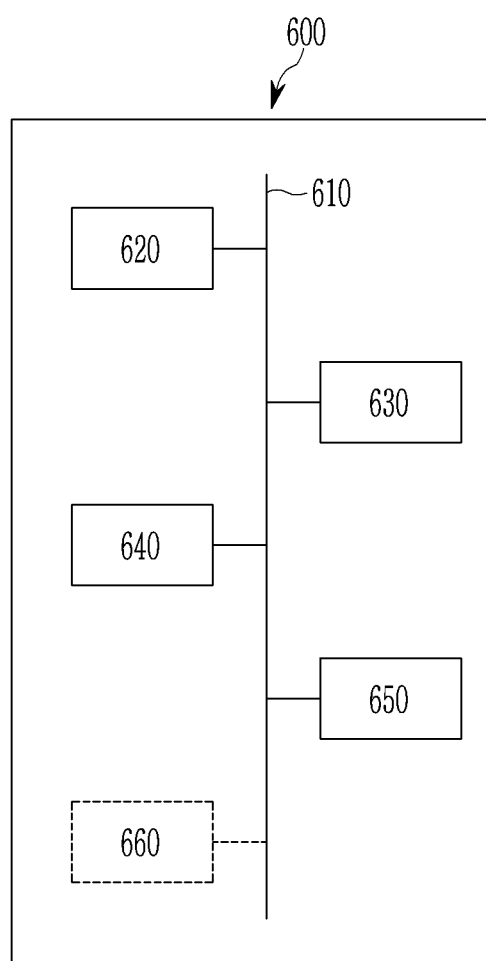
FIG. 9 is a diagram illustrating an electronic device 600 according to some example embodiments.

FIG. 9 is a diagram illustrating an electronic device 600 according to some example embodiments.

Referring to FIG. 9, the electronic device 600 includes a memory 620, a processor 630, an image sensor 640, and a communication interface 650. The image sensor 640 may include any of the image sensors illustrated and described herein, including image sensor 300 shown in FIGS. 4 and 5A-5B and image sensor 400 shown in FIGS. 7 and 8A-8B.

The electronic device 600 may be included in one or more various electronic devices, including, for example, a mobile phone, a digital camera, etc. In example embodiments, the electronic device 600 may include one or more of an image providing server, a mobile device, a computing device, an image outputting device, and an image capturing device. A mobile device may include a mobile phone, a smartphone, a personal digital assistant (PDA), some combination thereof, etc. A computing device may include a personal computer (PC), a tablet computer, a laptop computer, a netbook, some combination thereof, etc. An image outputting device may include a TV, a smart TV, some combination thereof, etc. An image capturing device may include a camera, a camcorder, some combination thereof, etc.

The memory 620, the processor 630, the image sensor 640, and the communication interface 650 may communicate with one another through a bus 610.

The communication interface 650 may communicate data from an external device using various Internet protocols. For example, the communication interface 650 may communicate sensor data generated by the image sensor 640 to an external device. The external device may include, for example, an image providing server, a display device, a mobile device including, a mobile phone, a smartphone, a personal digital assistant (PDA), a tablet computer, and a laptop computer, a computing device including a personal computer (PC), a tablet PC, and a netbook, an image outputting device including a TV and a smart TV, and an image capturing device including a camera and a camcorder.

The processor 630 may execute a program and control the electronic device 600. A program code to be executed by the processor 630 may be stored in the memory 620. An electronic system may be connected to an external device through an input/output device (not shown) and exchange data with the external device.

The memory 620 may store information output from the image sensor 640, including information transmitted from the transistor 90. The memory 620 may be a volatile or a nonvolatile memory. The memory 620 may be a non-transitory computer readable storage medium. The memory may store computer-readable instructions that, when executed, cause the execution of one or more methods, functions, processes, etc. as described herein. In some example embodiments, the processor 630 may execute one or more of the computer-readable instructions stored at the memory 620.

In some example embodiments, the electronic device may include a display panel 660 that may output an image generated based at least in part upon information output from the image sensor 640.

In some example embodiments, element 660 may be absent from the electronic device 600. In some example embodiments, the communication interface 650 may include a USB and/or HDMI interface. In some example embodiments, the communication interface 650 may include a wireless communication interface.

Figure 10:
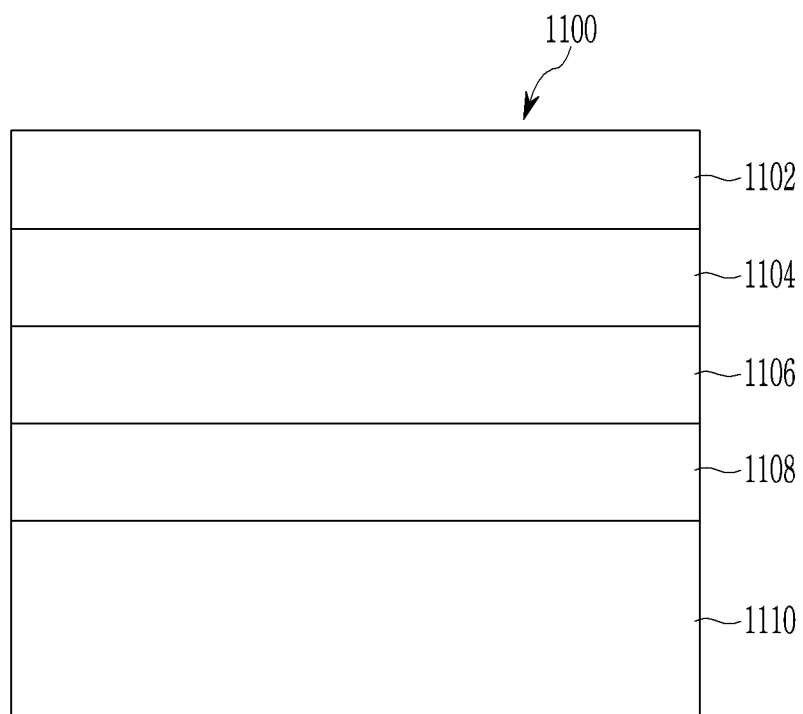
FIG. 10 is a cross-sectional view showing a solar cell according to some example embodiments.

FIG. 10 is a cross-sectional view showing a solar cell 1100 according to some example embodiments. Referring to FIG. 10, a solar cell 1100 includes a first electrode 1102 and a second electrode 1110, and a photoactive layer 1106 positioned between the first electrode 1102 and the second electrode 1110.

A substrate (not shown) may be positioned at the first electrode 1102 or the second electrode 1110, and may include a light-transmitting material. The light-transmitting material may include, for example, an inorganic material (e.g., glass), or an organic material (e.g., polycarbonate, polymethylmethacrylate, polyethylene terephthalate, polyethylene naphthalate, polyamide, polyethersulfone, or a combination thereof).

One of the first electrode 1102 and the second electrode 1110 is an anode and the other is a cathode. At least one of the first electrode 1102 and second electrode 1110 may be a light-transmitting electrode, and light may enter toward the light-transmitting electrode. The light-transmitting electrode may be made of, for example, a conductive oxide (e.g., indium tin oxide (ITO)), indium doped zinc oxide (IZO), tin oxide ($SnO_2$), aluminum-doped zinc oxide (AZO), and/or gallium-doped zinc oxide (GZO), or a transparent conductor of a conductive carbon composite (e.g., carbon nanotubes (CNT) or graphenes). At least one of the first electrode 1102 and the second electrode 1110 may be an opaque electrode, which may be made of an opaque conductor, for example, aluminum (Al), silver (Ag), gold (Au), and/or lithium (Li).

The photoactive layer 1106 may include an organic photoelectronic device according to some example embodiments.

First and second auxiliary layers 1104 and 1108 may be positioned between the first electrode 1102 and the photoactive layer 1106 and between the second electrode 1110 and the photoactive layer 1106, respectively. The first and second auxiliary layers 1104 and 1108 may increase charge mobility between the first electrode 1102 and the photoactive layer 1106 and between the second electrode 1110 and the photoactive layer 1106. The first and second auxiliary layers 1104 and 1106 may be at least one selected from, for example, an electron injection layer (EIL), an electron transport layer, a hole injection layer (HIL), a hole transport layer, and a hole blocking layer, but are not limited thereto. One or both of the first and second auxiliary layers 1104 and 1108 may be omitted.

The photoactive layer 1106 may have a tandem structure where at least two thereof are stacked.

Figure 11:
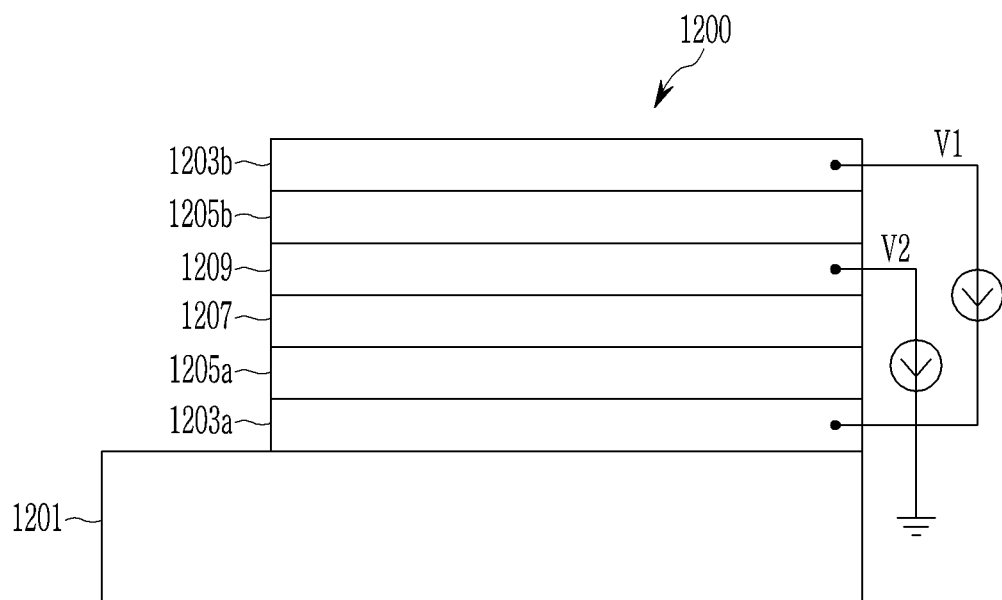
FIG. 11 is a sectional view of an organic light-emitting display apparatus according to some example embodiments.

FIG. 11 is a sectional view of an organic light-emitting display apparatus 1200 according to some example embodiments.

Referring to FIG. 11, a first electrode 1203a and a second electrode 1203b are positioned on a substrate 1201, a first emission layer 1205a is positioned on the first electrode 1203a, and a second emission layer 1205b is positioned under the second electrode 1203b.

The substrate 1201 may include a material selected from the group consisting of glass, quartz, silicon, a synthetic resin, a metal, and a combination thereof. The synthetic resin may include polyethylene naphthalate (PEN), polyethylene terephthalate (PET), polycarbonate, polyvinyl alcohol, polyacrylate, polyimide, polynorbornene and/or polyethersulfone (PES), etc. The metal plate may include a stainless steel foil and/or an aluminum foil, etc.

The first electrode 1203a may include a material having a work function of about 4.3 eV to about 5.0 eV, about 4.3 eV to about 4.7 eV, or about 4.3 eV to about 4.5 eV. According to example embodiments, the material may include aluminum (Al), copper (Cu), magnesium (Mg), molybdenum (Mo) and/or an alloy thereof, etc. In addition, these metals may be laminated to provide a first electrode. The first electrode 1203a may have a thickness of about 120 to about 120 nm.

The second electrode 1203b may include a material having a work function of about 12.3 eV to about 12.7 eV or about 12.5 eV to about 12.7 eV. According to some example embodiments, the second electrode 1203b may include Ba:Al. The second electrode 1203b may have a thickness of about 120 to about 120 nm.

The first emission layer 1205a and the second emission layer 1205b may include an organic photoelectronic device according to some example embodiments.

A middle electrode 1209 is positioned between the first emission layer 1205a and the second emission layer 1205b. The middle electrode 1209 may include a material having a work function of about 5.0 eV to about 5.2 eV. According to some example embodiments, the material may include a conductive polymer. The conductive polymer may include polythiophene, polyaniline, polypyrrole, polyacene, polyphenylene, polyphenylenevinylene, a derivative thereof, a copolymer thereof, or a mixture thereof.

A buffer layer 1207 may be positioned between the first emission layer 1205a and the middle electrode 1209, and may include a material selected from the group consisting of a metal oxide, a polyelectrolyte, and combinations thereof. The combination thereof refers to the metal oxide and polyelectrolyte being mixed or laminated to provide a multilayer. In addition, the different kinds of metal oxide or polyelectrolyte may be laminated.

Figure 12:
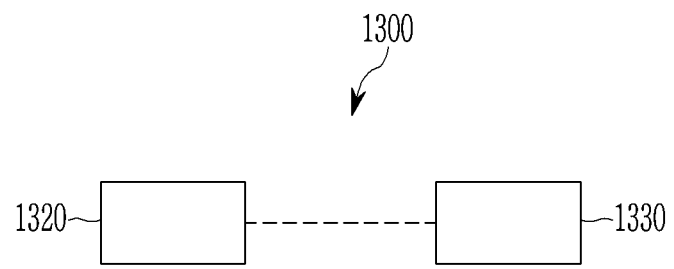
FIG. 12 is a view showing a sensor according to some example embodiments.

FIG. 12 is a view showing a sensor 1300 according to some example embodiments.

Referring to FIG. 12, a sensor 1300 (for example a gas sensor, light sensor, energy sensor, but example embodiments are not limited thereto) includes at least one electrode 1320 configured to output a signal to a processor 1330. The processor 1330 may include a microprocessor, but example embodiments are not limited thereto. The electrode 1320 may include an organic photoelectronic device according to some example embodiments.

Hereinafter, the present disclosure is illustrated in more detail with reference to examples. However, these examples are exemplary, and the present disclosure is not limited thereto.

Manufacture of Organic Photoelectronic Device I

Example 1

An about 150 nm-thick anode is formed by sputtering ITO on a glass substrate. On the anode, a 5 nm-thick lower buffer layer is formed by depositing a compound represented by Chemical Formula A. On the lower buffer layer, a 110 nm-thick light-absorption layer is formed by codepositing a compound represented by Chemical Formula B as a p-type light-absorbing material, C60 as an n-type light-absorbing material and molybdenum oxide (MoOx, 0<x≤3). Herein, the light-absorption layer has a 15 nm-thick lower photoelectric conversion region formed by binary-codepositing the p-type light-absorbing material and the n-type light-absorbing material in a volume ratio of 2:1, a 20 nm-thick doped region formed by ternary-codepositing the p-type light-absorbing material, the n-type light-absorbing material, and a molybdenum oxide in a volume ratio of 2:1:2 among them, and a 75 nm-thick upper photoelectric conversion region formed by binary-codepositing the p-type light-absorbing material and the n-type light-absorbing material in a volume ratio of 2:1. Subsequently, on the light-absorption layer, a 7 nm-thick cathode is formed by sputtering ITO, and a 50 nm-thick high refractive layer is formed thereon by depositing an aluminum oxide to manufacture an organic photoelectronic device.

[Chemical Formula A]

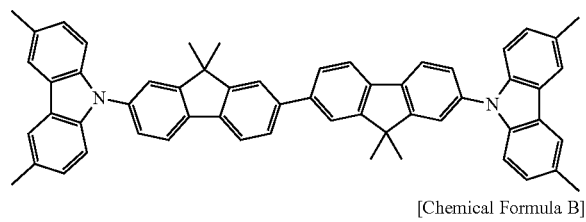

[Chemical Formula B]

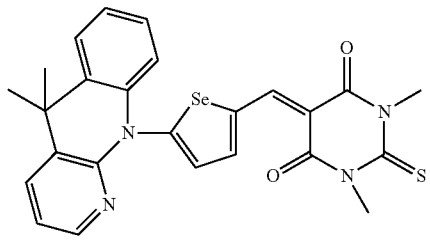

Example 2

An organic photoelectronic device is manufactured according to the same method as Example 1 except for binary-codepositing a p-type light-absorbing material and a n-type light-absorbing material in a volume ratio of 2:1 to form a 30 nm-thick lower photoelectric conversion region, ternary-codepositing the p-type light-absorbing material, the n-type light-absorbing material, and a molybdenum oxide in a volume ratio of 2:1:2 to form a 20 nm-thick doped region, and binary-codepositing the p-type light-absorbing material and the n-type light-absorbing material in a volume ratio of 2:1 to form a 60 nm-thick upper photoelectric conversion region during formation of the light-absorption layer.

Example 3

An organic photoelectronic device is manufactured according to the same method as Example 1 except for binary-codepositing a p-type light-absorbing material and a n-type light-absorbing material in a volume ratio of 2:1 between them to form a 30 nm-thick lower photoelectric conversion region, ternary-codepositing the p-type light-absorbing material, the n-type light-absorbing material, and a molybdenum oxide in a volume ratio of 2:1:1 among them to form a 20 nm-thick doped region, and binary-codepositing the p-type light-absorbing material and the n-type light-absorbing material in a volume ratio of 2:1 between them to form a 60 nm-thick upper photoelectric conversion region during formation of the light-absorption layer.

Example 4

An organic photoelectronic device is manufactured according to the same method as Example 1 except for binary-codepositing a p-type light-absorbing material and a n-type light-absorbing material in a volume ratio of 2:1 between them to form a 45 nm-thick lower photoelectric conversion region, ternary-codepositing the p-type light-absorbing material, the n-type light-absorbing material, and a molybdenum oxide in a volume ratio of 2:1:2 among them to form a 20 nm-thick doped region, and binary-codepositing the p-type light-absorbing material and the n-type light-absorbing material in a volume ratio of 2:1 between them to form a 45 nm-thick upper photoelectric conversion region during formation of the light-absorption layer.

Comparative Example 1

An organic photoelectronic device is manufactured according to the same method as Example 1 except for forming a 110 nm-thick light-absorption layer having a volume ratio of 2:1 by binary-codepositing the p-type light-absorbing material and the n-type light-absorbing material.

Evaluation I

External quantum efficiency (EQE) of the organic photoelectronic devices of Examples 1 to 4 and Comparative Example 1 depending on a wavelength region is compared.

The external quantum efficiency (EQE) is evaluated in a 400 nm to 720 nm wavelength region ($\lambda$max=570 nm) in an Incident Photon to Current Efficiency (IPCE) method. A green wavelength region has a reference wavelength of about 570 nm as a maximum absorption wavelength ($\lambda_{max}$), and a blue wavelength region has a reference wavelength of 450 nm.

The results are provided in Table 1.

TABLE 1

| | EQE$_{max(G)}$ (%) | EQE$_{450\,nm(B)}$ (%) | EQE$_{max(G)}$/EQE$_{450\,nm(B)}$ | Full width at half maximum (FWHM) (nm) |
|---|---|---|---|---|
| Example 1 | 63.9 | 15.2 | 4.20 | 102 |
| Example 2 | 59.6 | 11.5 | 5.17 | 100 |
| Example 3 | 58.6 | 12.1 | 4.83 | 97 |
| Example 4 | 56.9 | 8.4 | 6.76 | 93 |
| Comparative Example 1 | 66.8 | 18.2 | 3.67 | 110 |

Referring to Table 1, the organic photoelectronic devices according to Examples 1 to 4 shows low absorption of blue light and improved wavelength selectivity of green light.

Manufacture of Organic Photoelectronic Device II

Example 5

An about 150 nm-thick anode is formed by sputtering by ITO on a glass substrate. On the anode, a 110 nm-thick light-absorption layer is formed by codepositing a compound represented by Chemical Formula C as a p-type light-absorbing material, C60 as an n-type light-absorbing material, and molybdenum oxide (MoOx, 0<x≤3). Herein, the light-absorption layer has a 30 nm-thick lower photoelectric conversion region formed by binary-codepositing the p-type light-absorbing material and the n-type light-absorbing material in a volume ration of 2:1, a 20 nm-thick doped region formed by ternary-codepositing the p-type light-absorbing material, the n-type light-absorbing material, and a molybdenum oxide in a volume ration of 2:1:2, and a 60 nm-thick upper photoelectric conversion region formed by binary-codepositing the p-type light-absorbing material and the n-type light-absorbing material in a volume ratio of 2:1. Subsequently, on the light-absorption layer, a 10 nm-thick upper buffer layer is formed by depositing MoOx (0<x≤3):Al (1:1 wt/wt). On the upper buffer layer, a 7 nm-thick cathode is formed by sputtering ITO, and a 50 nm-thick high refractive layer is formed thereon by depositing an aluminum oxide as a high refractive film to manufacture an organic photoelectronic device.

[Chemical Formula C]

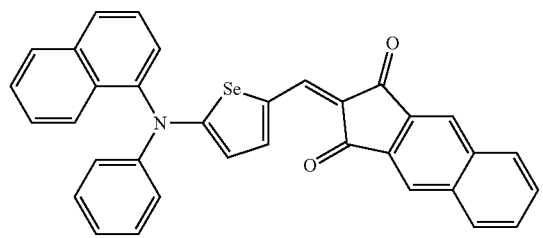

Comparative Example 2

An organic photoelectronic device is manufactured according to the same method as Example 5 except for forming a 110 nm-thick light-absorption layer having a volume ratio of 2:1 by binary-codepositing the p-type light-absorbing material and the n-type light-absorbing material.

Evaluation II

External quantum efficiency (EQE) of the organic photoelectronic devices according to Example 5 and Comparative Example 2 depending on a wavelength region is compared. The results are shown in Table 2.

TABLE 2

| | EQE$_{max(G)}$ (%) | EQE$_{450\,nm(B)}$ (%) | EQE$_{max(G)}$/EQE$_{450\,nm(B)}$ | Full width at half maximum (FWHM) (nm) |
|---|---|---|---|---|
| Example 5 | 51.6 | 9.4 | 5.49 | 104 |
| Comparative Example 2 | 45.3 | 12.1 | 3.74 | 113 |

Referring to Table 2, the organic photoelectronic device of Example 5 absorbs lower blue light and thus shows improved wavelength selectivity of green light.

Manufacture of Organic Photoelectronic Device III

Example 6

An about 150 nm-thick anode is formed by sputtering ITO on a glass substrate. On the anode, a 5 nm-thick lower buffer layer is formed by depositing a compound represented by Chemical Formula A. On the lower buffer layer, a 110 nm-thick light-absorption layer is formed by codepositing a compound represented by Chemical Formula D as a p-type light-absorbing material, C60 as a n-type light-absorbing material, and molybdenum oxide (MoOx, 0<x≤3). Herein, the light-absorption layer has a 30 nm-thick lower photoelectric conversion region formed by binary-codepositing the p-type light-absorbing material and the n-type light-absorbing material in a volume ratio of 1.5:1, a 20 nm-thick doped region formed by ternary-codepositing the p-type light-absorbing material, the n-type light-absorbing material, and the molybdenum oxide in a volume ratio of 1.5:1:1.5, and a 60 nm-thick upper photoelectric conversion region formed by binary-codepositing the p-type light-absorbing material and the n-type light-absorbing material in a volume ratio of 1.5:1. On the light-absorption layer, a 7 nm-thick cathode is formed by sputtering ITO, and a 50 nm-thick high refractive layer is formed by depositing an aluminum oxide thereon to manufacture an organic photoelectronic device.

[Chemical Formula D]

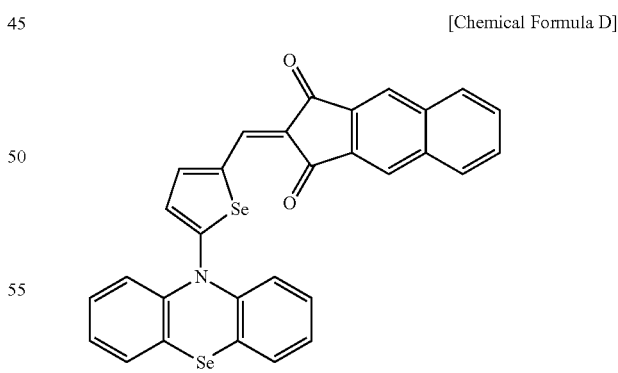

Example 7

An organic photoelectronic device is manufactured according to the same method as Example 6 except for forming 20 nm-thick lower photoelectric conversion region by binary-codepositing a p-type light-absorbing material and a n-type light-absorbing material in a volume ratio of 2:1 between them to form a 45 nm-thick lower photoelectric conversion region, ternary-codepositing the p-type light-absorbing material, the n-type light-absorbing material, and a molybdenum oxide in a volume ratio of 2:1:2 among them to form a 20 nm-thick doped region, and binary-codepositing the p-type light-absorbing material and the n-type light-absorbing material in a volume ratio of 2:1 between them to form a 70 nm-thick upper photoelectric conversion region during formation of the light-absorption layer.

Comparative Example 3

An organic photoelectronic device is manufactured according to the same method as Example 6 except for forming a 110 nm-thick light-absorption layer having a volume ratio of 1.5:1 by binary-codepositing the p-type light-absorbing material and the n-type light-absorbing material.

Comparative Example 4

An organic photoelectronic device is manufactured according to the same method as Example 6 except for forming a 110 nm-thick light-absorption layer having a volume ratio of 2:1 by binary-codepositing the p-type light-absorbing material and the n-type light-absorbing material.

Evaluation III

External quantum efficiency (EQE) of each organic photoelectronic device according to Example 6 and Comparative Example 3 depending on a wavelength region is compared. Likewise, external quantum efficiency of the organic photoelectronic devices according to Example 7 and Comparative Example 4 depending on a wavelength region is compared.

The results are shown in Tables 3 and 4.

TABLE 3

|  | $EQE_{max(G)}$ (%) | $EQE_{450\,nm(B)}$ (%) | $EQE_{max(G)}/EQE_{450\,nm(B)}$ | Full width at half maximum (FWHM) (nm) |
|---|---|---|---|---|
| Example 6 | 60.1 | 15.0 | 4.00 | 107 |
| Comparative Example 3 | 59.5 | 20.7 | 2.87 | 127 |

TABLE 4

|  | $EQE_{max(G)}$ (%) | $EQE_{450nm(B)}$ (%) | $EQE_{max(G)}/EQE_{450\,nm(B)}$ | Full width at half maximum (FWHM) (nm) |
|---|---|---|---|---|
| Example 7 | 53.6 | 13.9 | 3.86 | 112 |
| Comparative Example 4 | 45.7 | 15.8 | 2.89 | 131 |

Referring to Tables 3 and 4, the organic photoelectronic devices according to Examples 6 and 7 absorbs low blue light and thus shows improved wavelength selectivity of green light.

While this disclosure has been described in connection with what is presently considered to be practical example embodiments, it is to be understood that the inventive concepts are not limited to the disclosed embodiments, but, on the contrary, is intended to cover various modifications and equivalent arrangements included within the spirit and scope of the appended claims.

What is claimed is:

1. An organic photoelectronic device, comprising:
a first electrode and a second electrode facing each other, one of the first electrode and the second electrode being an anode of the organic photoelectronic device and the other being a cathode of the organic photoelectronic device; and
a light-absorption layer between the first electrode and the second electrode, the light-absorption layer including,
a first photoelectric conversion region nearer to the first electrode, and a second photoelectric conversion region nearer to the second electrode, and
a doped region between the first photoelectric conversion region and the second photoelectric conversion region, such that the first photoelectric conversion region, the doped region, and the second photoelectric conversion region are sequentially disposed along a thickness direction of the light-absorption layer,
wherein each of the first photoelectric conversion region and the second photoelectric conversion region includes a p-type light-absorbing material and an n-type light-absorbing material forming a bulk heterojunction, at least one of the p-type light-absorbing material and the n-type light-absorbing material being configured to selectively absorb a part of visible light, and
the doped region includes the p-type light-absorbing material, the n-type light-absorbing material, and an exciton quencher,
wherein, in the doped region, the exciton quencher is included in each of the p-type light-absorbing material and the n-type light-absorbing material as a dopant,
the exciton quencher includes a metal, a semi-metal, a metal oxide, a semi-metal oxide, or a combination thereof.

2. The organic photoelectronic device of claim 1, wherein the second electrode is nearer to a light incidence side than the first electrode, and
a thickness of the second photoelectric conversion region is the same as or larger than a thickness of the first photoelectric conversion region.

3. The organic photoelectronic device of claim 1,
wherein the exciton quencher is copper, silver, gold, aluminum, a molybdenum oxide, a tungsten oxide, a vanadium oxide, a rhenium oxide, a nickel oxide, or a combination thereof.

4. The organic photoelectronic device of claim 1, wherein the exciton quencher is included in an amount less than or equal to about 50 volume % based on the amount of the doped region.

5. The organic photoelectronic device of claim 1, wherein at least one of the p-type light-absorbing material and the n-type light-absorbing material selectively absorbs at least one of a wavelength greater than or equal to about 400 nm and less than 500 nm, a wavelength region of about 500 nm to about 600 nm, and a wavelength region of greater than about 600 nm and less than or equal to about 700 nm.

6. The organic photoelectronic device of claim 1, wherein
the light-absorption layer absorbs first visible light and second visible light that are different wavelength regions from each other,
the first visible light is absorbed at maximum in the first photoelectric conversion region or the second photoelectric conversion region, and
the second visible light is absorbed at maximum in the doped region.

7. The organic photoelectronic device of claim 6, wherein
one of the p-type light-absorbing material and the n-type light-absorbing material selectively absorbs the first visible light, and
the other of the p-type light-absorbing material and the n-type light-absorbing material absorb the first visible light and the second visible light.

8. The organic photoelectronic device of claim 7, wherein
the first visible light is in a wavelength region of about 500 nm to about 600 nm, and
the second visible light is in a wavelength of greater than or equal to about 400 nm and less than 500 nm.

9. The organic photoelectronic device of claim 8, wherein external quantum efficiency of the organic photoelectronic device for the first visible light and the second visible light satisfies Relationship Equation 1:

$$EQE_{max}/EQE_{450\,nm} \geq 3.80 \quad \text{[Relationship Equation 1]}$$

wherein, in Relationship Equation 1, $EQE_{max}$ is external quantum efficiency of the first visible light at a maximum absorption wavelength which is measured using an incident photon to current efficiency (IPCE), and $EQE_{450\,nm}$ is external quantum efficiency at 450 nm which is measured using an incident photon to current efficiency (IPCE).

10. The organic photoelectronic device of claim 7, wherein
the p-type light-absorbing material selectively absorbs the first visible light, and
the n-type light-absorbing material absorbs the first visible light and the second visible light.

11. The organic photoelectronic device of claim 10, wherein the n-type light-absorbing material is fullerene or a fullerene derivative.

12. The organic photoelectronic device of claim 10, wherein the p-type light-absorbing material is an organic material including a core structure including an electron donating moiety, a pi conjugation linking group, and an electron accepting moiety.

13. The organic photoelectronic device of claim 12, wherein the p-type light-absorbing material is a compound represented by Chemical Formula 1:

[Chemical Formula 1]

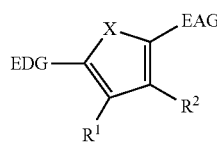

wherein, in Chemical Formula 1,
X is Se, Te, SO, SO$_2$, or SiR$^a$R$^b$,
EDG is an electron donating group,
EAG is an electron accepting group, and
each of R$^1$, R$^2$, R$^a$, and R$^b$ are independently hydrogen or a monovalent substituent.

14. The organic photoelectronic device of claim 13, wherein the p-type light-absorbing material is a compound represented by Chemical Formula 1A or 1B:

[Chemical Formula 1A]

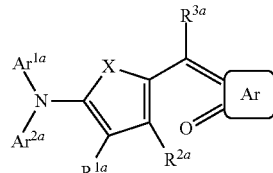

[Chemical Formula 1B]

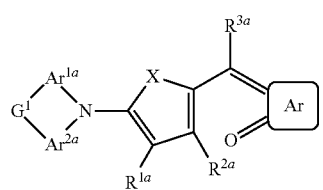

wherein, in Chemical Formula 1A or 1B,

X is Se, Te, SO, SO$_2$, or SiR$^a$R$^b$,

Ar is a substituted or unsubstituted 5-membered ring, a substituted or unsubstituted 6-membered ring, or a condensed ring of the two or more foregoing rings, each of Ar$^{1a}$ and Ar$^{2a}$ are independently a substituted or unsubstituted C$_6$ to C$_{30}$ aryl group or a substituted or unsubstituted C$_3$ to C$_{30}$ heteroaryl group, G$^1$ is selected from a single bond, —(CR$^g$R$^h$)$_{n2}$—, —O—, —S—, —Se—, —N=, —NR$^i$—, —SiR$^j$R$^k$—, and —GeR$^l$R$^m$—, wherein n2 is 1 or 2, and each of R$^{1a}$ to R$^{3a}$, R$^a$, and R$^b$ are independently hydrogen, a substituted or unsubstituted C$_1$ to C$_{30}$ alkyl group, a substituted or unsubstituted C$_6$ to C$_{30}$ aryl group, a substituted or unsubstituted C$_3$ to C$_{30}$ heteroaryl group, a substituted or unsubstituted C$_1$ to C$_6$ alkoxy group, a halogen, or a cyano group.

15. The organic photoelectronic device of claim 14, wherein the p-type light-absorbing material is a compound represented by one of Chemical Formulae 1A-1 to 1B-4:

[Chemical Formula 1A-1]

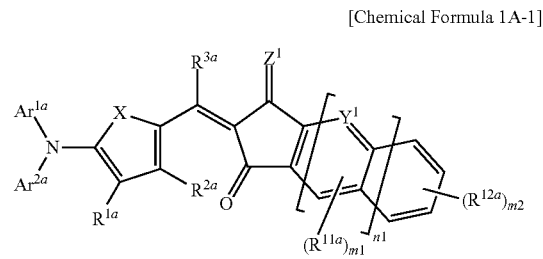

[Chemical Formula 1A-2]

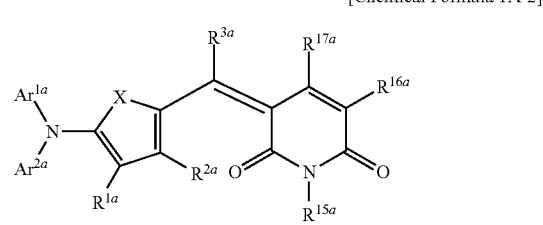

-continued

[Chemical Formula 1A-3]

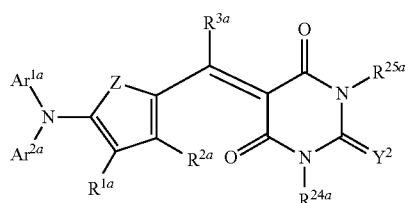

[Chemical Formula 1A-4]

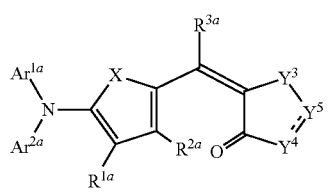

[Chemical Formula 1B-1]

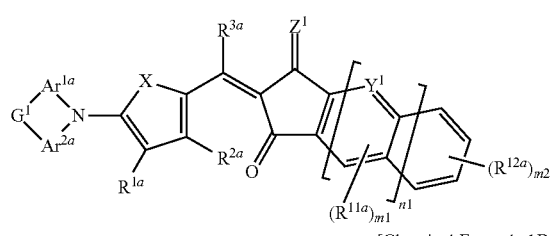

[Chemical Formula 1B-2]

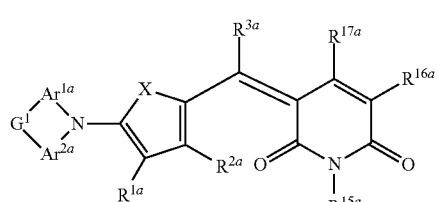

[Chemical Formula 1B-3]

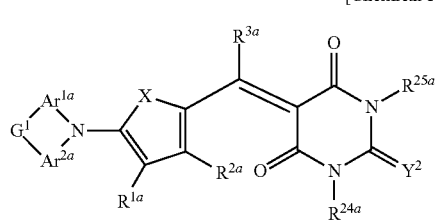

[Chemical Formula 1B-4]

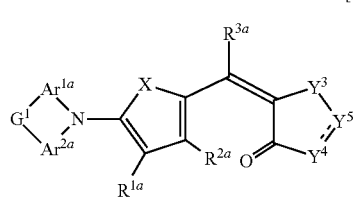

wherein, in Chemical Formulae 1A-1 to 1B-4,
X is Se, Te, SO, $SO_2$, or $SiR^aR^b$,
$Z^1$ is O or $CR^cR^d$,
$Y^1$ is N or $CR^e$,
$Y^2$ is selected from O, S, Se, Te, and $C(R^f)(CN)$,
$Y^3$ is O, S, Se, or Te,
$Y^4$ is N or $NR^{18a}$,
$Y^5$ is $CR^{19a}$ or $C=CR^{20a}(CN)$,
each of $Ar^{1a}$ and $Ar^{2a}$ are independently a substituted or unsubstituted $C_6$ to $C_{30}$ aryl group or a substituted or unsubstituted $C_3$ to $C_{30}$ heteroaryl group,
$G^1$ is selected from a single bond, $-(CR^gR^h)_{n2}-$, $-O-$, $-S-$, $-Se-$, $-N=$, $-NR^i-$, $-SiR^jR^k-$, and $-GeR^lR^m-$, wherein n2 is 1 or 2,
each of $R^{1a}$ to $R^{3a}$, $R^{11a}$, $R^{12a}$, $R^{15a}$ to $R^{20a}$, $R^{24a}$, $R^{25a}$, and $R^a$ to $R^f$ are independently hydrogen, a substituted or unsubstituted $C_1$ to $C_{30}$ alkyl group, a substituted or unsubstituted $C_6$ to $C_{30}$ aryl group, a substituted or unsubstituted $C_3$ to $C_{30}$ heteroaryl group, a substituted or unsubstituted $C_1$ to $C_6$ alkoxy group, a halogen, or a cyano group,
n1 is 0 or 1,
m1 is 0 or 1, and
m2 is an integer of 0 to 4.

16. An image sensor comprising the organic photoelectronic device of claim 1.

17. An electronic device comprising the image sensor of claim 16.

18. The electronic device of claim 17, wherein the electronic device is a solar cell, an image sensor, a photo-detector, a photo-sensor, and an organic light emitting diode (OLED).

19. An image sensor comprising:
a semiconductor substrate integrated with at least one first photo-sensing device and at least one second photo-sensing device, the first photo-sensing device configured to sense light in one of a first visible light and second visible light wavelength region and the second photo-sensing device configured to sense light in another of the first visible light and second visible light wavelength region; and
at least one third photo-sensing device on the semiconductor substrate, the third photo-sensing device configured to selectively absorb light in a third visible light wavelength region different from the first and second visible light wavelength regions, the third photo-sensing device including the organic photoelectronic device of claim 1.

20. The image sensor of claim 19, wherein
the first visible light is in a wavelength region of greater than about 600 nm and less than or equal to about 700 nm,
the second visible light is in a wavelength of greater than or equal to about 400 nm and less than 500 nm, and
the third visible light is in a wavelength of about 500 nm to about 600 nm.

* * * * *